United States Patent
Rice et al.

(10) Patent No.: US 7,503,448 B2
(45) Date of Patent: Mar. 17, 2009

(54) BREAK-AWAY POSITIONING CONVEYOR MOUNT FOR ACCOMMODATING CONVEYOR BELT BENDS

(75) Inventors: Michael R. Rice, Pleasanton, CA (US); Eric A. Englhardt, Palo Alto, CA (US); Robert B. Lowrance, Los Gatos, CA (US); Martin R. Elliott, Round Rock, TX (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/554,969

(22) Filed: Oct. 31, 2006

(65) Prior Publication Data

US 2007/0056829 A1   Mar. 15, 2007

Related U.S. Application Data

(63) Continuation of application No. 10/987,955, filed on Nov. 12, 2004, now Pat. No. 7,156,221.

(60) Provisional application No. 60/520,049, filed on Nov. 13, 2003.

(51) Int. Cl.
  *B65G 17/20* (2006.01)
(52) U.S. Cl. .................. 198/678.1; 198/680; 198/683; 198/465.4
(58) Field of Classification Search ............. 198/465.4, 198/475.1, 680, 683, 678.1
See application file for complete search history.

(56) References Cited

U.S. PATENT DOCUMENTS

| | | | |
|---|---|---|---|
| 3,952,860 A | 4/1976 | Specht | |
| 4,180,152 A | 12/1979 | Sefcik | |
| 5,253,742 A | 10/1993 | Dooley | |
| 5,921,368 A * | 7/1999 | Zaguroli, Jr. | 198/678.1 |
| 5,980,183 A | 11/1999 | Fosnight | |
| 5,996,771 A | 12/1999 | Estes | |
| 6,382,397 B2 | 5/2002 | Maeder | |
| 6,431,347 B1 | 8/2002 | Gossner | |
| 6,579,052 B1 | 6/2003 | Bonora et al. | |
| 7,051,870 B2 | 5/2006 | Schoendienst et al. | |
| 2003/0010449 A1 * | 1/2003 | Gramarossa et al. | 156/345.31 |

* cited by examiner

*Primary Examiner*—James R Bidwell
(74) *Attorney, Agent, or Firm*—Dugan & Dugan

(57) ABSTRACT

A break-away mounting system for a continuous-motion, high-speed position conveyor system is disclosed. A support cradle may be suspended from a conveyor belt such that the support cradle maintains a fixed position and orientation relative to at least one point on the conveyor belt without inducing appreciable stress on the conveyor belt, the support cradle, or the coupling between the conveyor belt and the support cradle. The mount may include a leading rotatable bearing attached to the support cradle which may releasably engage a first key attached to the conveyor belt, the rotatable bearing adapted to accommodate rotational forces applied to the support cradle by the conveyor belt. The mount may also include a slide bearing attached to the support cradle which may releasably engage a second key attached to the conveyor belt, the slide bearing adapted to accommodate longitudinal forces applied to the support cradle by the conveyor belt.

20 Claims, 27 Drawing Sheets

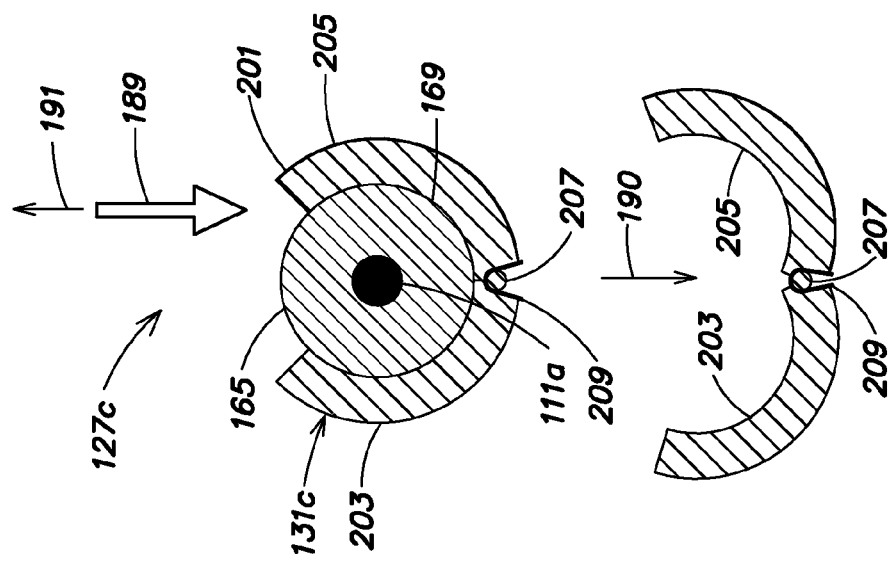
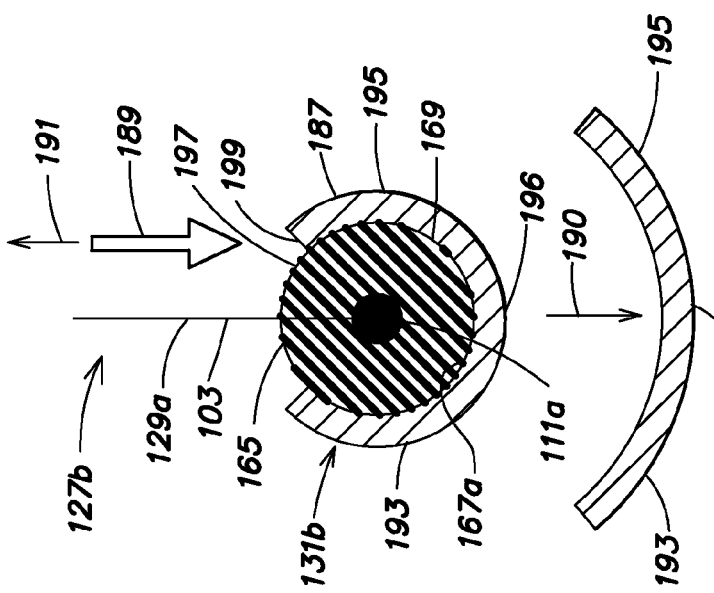
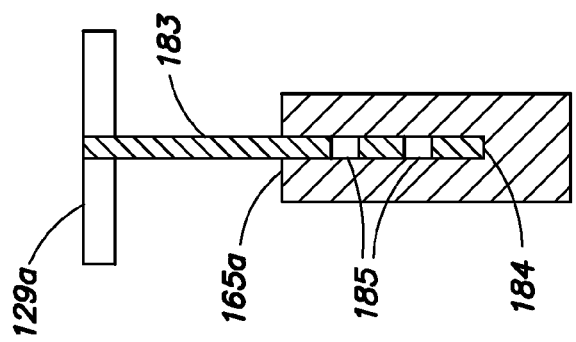
FIG. 6
FIG. 7
FIG. 8

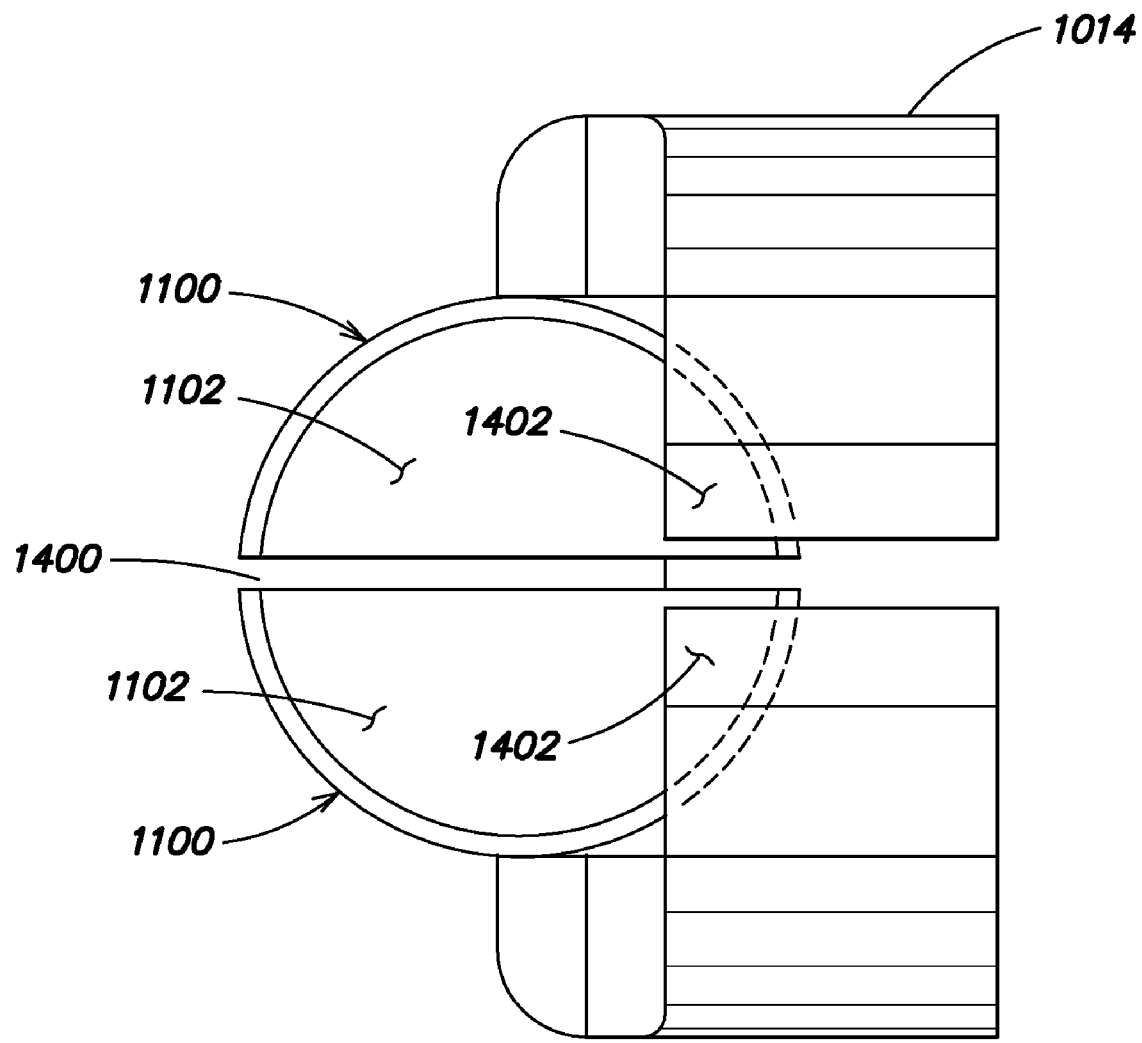
FIG. 14D1

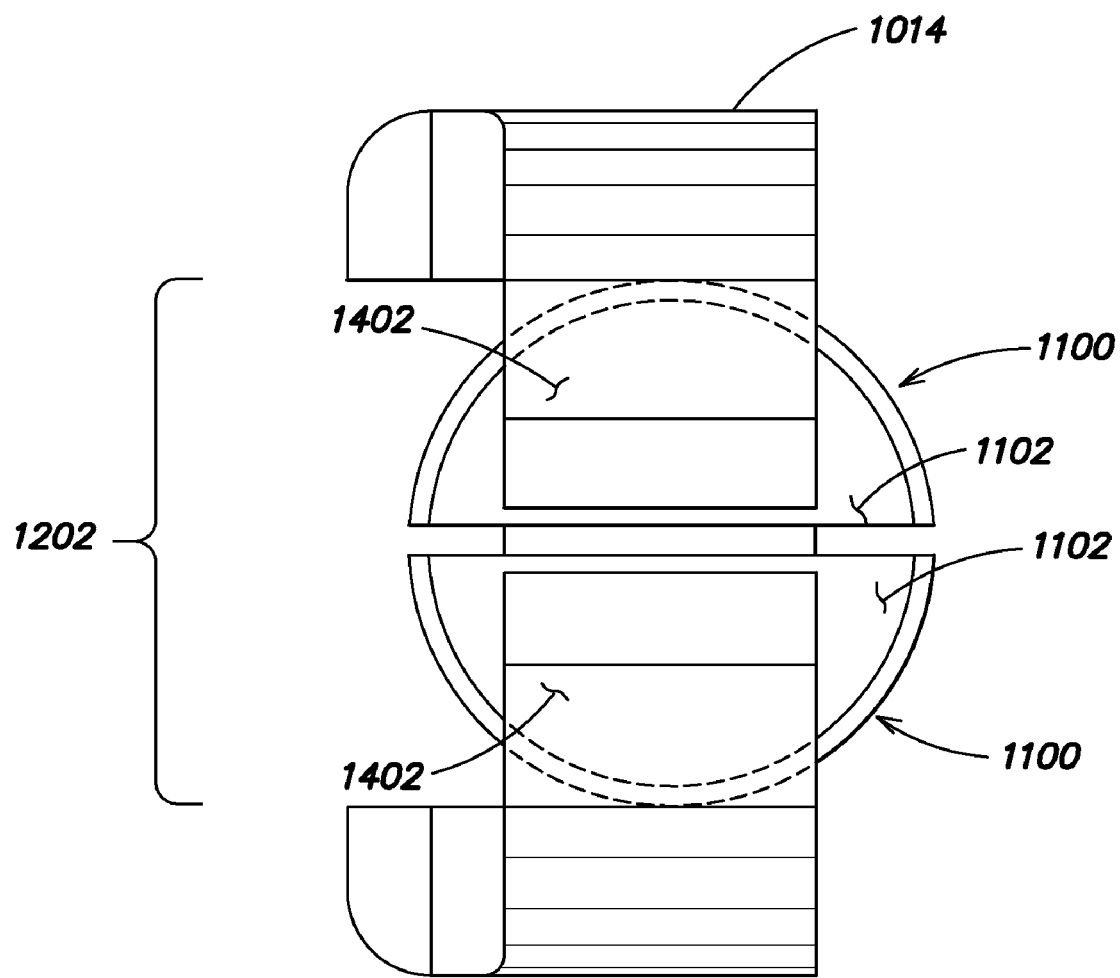
FIG. 14D2

BREAK-AWAY POSITIONING CONVEYOR MOUNT FOR ACCOMMODATING CONVEYOR BELT BENDS

This application is a continuation of and claims priority to U.S. patent application Ser. No. 10/987,955, filed Nov. 12, 2004, now U.S. Pat. No. 7,156,221 entitled "Break-Away Positioning Conveyor Mount For Accommodating Conveyor Belt Bends" which claims priority to U.S. Provisional Patent Application Ser. No. 60/520,049, filed Nov. 13, 2003, entitled "Singulation Of Conveyed Articles". Each of these applications is hereby incorporated by reference herein in its entirety for all purposes.

CROSS REFERENCE TO RELATED APPLICATIONS

The present application is related to the following commonly-assigned, co-pending U.S. patent applications, each of which is hereby incorporated herein by reference in its entirety for all purposes:

U.S. patent application Ser. No. 10/650,310, filed Aug. 28, 2003 and titled "System For Transporting Substrate Carriers";

U.S. patent application Ser. No. 10/650,312, filed Aug. 28, 2003 and titled "Method and Apparatus for Using Substrate Carrier Movement to Actuate Substrate Carrier Door Opening/Closing";

U.S. patent application Ser. No. 10/650,481, filed Aug. 28, 2003 and titled "Method and Apparatus for Unloading Substrate Carriers from Substrate Carrier Transport Systems";

U.S. patent application Ser. No. 10/650,479, filed Aug. 28, 2003 and titled "Method and Apparatus for Supplying Substrates to a Processing Tool";

U.S. Provisional Patent Application No. 60/407,452, filed Aug. 31, 2002 and titled "End Effector Having Mechanism For Reorienting A Wafer Carrier Between Vertical And Horizontal Orientations";

U.S. Provisional Patent Application No. 60/407,337, filed Aug. 31, 2002, and titled "Wafer Loading Station with Docking Grippers at Docking Stations";

U.S. patent application Ser. No. 10/650,311, filed Aug. 28, 2003 and titled "Substrate Carrier having Door Latching and Substrate Clamping Mechanism";

U.S. patent application Ser. No. 10/650,480, filed Aug. 28, 2003 and titled "Substrate Carrier Handler That Unloads Substrate Carriers Directly From a Moving Conveyor";

U.S. patent application Ser. No. 10/764,982, filed Jan. 26, 2004 and titled "Methods and Apparatus for Transporting Substrate Carriers";

U.S. patent application Ser. No. 10/764,820, filed Jan. 26, 2004, and titled "Overhead Transfer Flange and Support for Suspending Substrate Carrier";

U.S. Provisional Patent Application No. 60/443,115, filed Jan. 27, 2003, and titled "Apparatus and Method for Storing and Loading Wafer Carriers";

U.S. Provisional Patent Application No. 60/520,180, filed Nov. 13, 2003, and titled "Calibration of High Speed Loader to Substrate Transport System";and U.S. Provisional Patent Application No. 60/520,035, filed Nov. 13, 2003, and titled "Apparatus and Method for Transporting Substrate Carriers Between Conveyors".

FIELD OF THE INVENTION

The present invention relates generally to systems for fabricating electronic devices, and is more particularly concerned with transportation of substrate carriers within a fabrication facility.

BACKGROUND OF THE INVENTION

Prior art systems for conveying articles (e.g., workpieces such as substrates, or workpiece containers such as substrate carriers or FOUPs) through a transport path within a fabrication facility may include a cradle upon which conveyed articles may be loaded. Such systems stop at different process tools to load or unload substrate carriers from the cradles or tools as needed. Typically the cradles come to rest and a robotic arm using an end effector removes a carrier from a cradle or loads a carrier on a cradle.

In prior art systems where the cradle pivots freely on the conveyor or is otherwise allowed to move on the conveyor belt, the orientation of the carrier may be determined by, for example, a controller of the robotic arm when the carrier is removed. However, such systems are not suitable to be used as a continuously moving, high-speed conveyor system due to the time it may take for the carrier to stop rotating (or otherwise moving), the time it may take to determine the carrier orientation, and the time required to remove the carrier from the cradle.

In prior art conveyor systems where the cradle is rigidly mounted to the conveyor, the conveyor system may be designed to tolerate the stresses that the cradle and the conveyor exert on each other as the cradle is moved through turns on the transport path. Such systems may be designed to function for at least a minimum acceptable time before the inherent stresses result in a failure of a component of the system. Such systems thus require regular maintenance to replace fatigued parts. Thus, such systems are not suitable to be used as a continuously moving, high speed conveyor system because of the maintenance requirement.

Therefore, systems and methods are needed to mount cradles to conveyors that are suitable for use in continuously moving, high speed transport systems.

SUMMARY OF THE INVENTION

In a first aspect of the present invention, a break-away mounting system for a continuous-motion, high-speed position conveyor system is provided. A support cradle may be suspended from a conveyor belt such that the support cradle maintains a fixed position and orientation relative to at least one point on the conveyor belt without inducing appreciable stress on the conveyor belt, the support cradle, or the coupling between the conveyor belt and the support cradle. The mount may include a leading rotatable bearing attached to the support cradle which may releasably engage a first key attached to the conveyor belt, the rotatable bearing being adapted to accommodate rotational forces applied to the support cradle by the conveyor belt. The mount may also include a slide bearing attached to the support cradle which may releasably engage a second key attached to the conveyor belt, the slide bearing being adapted to accommodate longitudinal forces applied to the support cradle by the conveyor belt.

In a second aspect, a method is provided that includes driving a conveyor belt continuously along a transport path having at least one bend and suspending a support cradle from the conveyor belt such that the support cradle maintains a fixed position and orientation relative to at least one point on the conveyor belt without inducing appreciable stress on the conveyor belt, the support cradle, or a coupling between the conveyor belt and the support cradle.

In a third aspect, an apparatus is provided that includes a conveyor belt and a support cradle mounted on the conveyor belt via a coupling adapted to accommodate rotational forces and a coupling adapted to accommodate longitudinal forces.

In a fourth aspect, an apparatus is provided that includes a conveyor belt, a mounting location on the conveyor belt including at least two keys, and a support including at least a rotatable bearing and a slide bearing that are adapted to engage either key. The support may be mounted on the conveyor belt at the mounting location by engaging the keys with the bearings.

In a fifth aspect, an apparatus is provided that includes a cradle, a rotatable bearing attached to the cradle, and a longitudinal bearing attached to the cradle. The bearings may be adapted to mount to a conveyor belt such that the orientation of a substrate carrier supported by the cradle remains known and consistent relative to the conveyor belt.

In a sixth aspect, an apparatus is provided that includes a conveyor belt and a plurality of keys attached to the conveyor belt. The keys may be adapted to engage a rotatable bearing and/or a longitudinal bearing. The keys may be identical to each other and may be adapted to engage both a rotatable bearing and a longitudinal bearing at different times. Different keys may be used with different bearings.

In a seventh aspect, a conveyed substrate carrier is longitudinally located at a longitudinal location of a conveyor belt (the meaning accorded herein to the term 'longitudinal location' being specifically discussed below), while inertial loads arising in the conveyed substrate carrier are distributed along multiple longitudinal locations of the conveyor belt. In at least one embodiment, this may reduce the potential for fatigue within the conveyor belt.

In an eighth aspect, a coupling interface is provided between a conveyor belt and a cradle of a positioning conveyor, wherein the coupling interface includes a coupling element adapted during ordinary use to longitudinally locate the cradle on a longitudinal location of the conveyor, and when urged by a frontal impact force of a predefined magnitude, to permit the cradle to deflect away from the longitudinal location. In at least one embodiment, this permits the cradle, as well as any conveyed article supported by the cradle, to become dislodged from the conveyor belt.

Other features and aspects of the present invention will become more fully apparent from the following detailed description of exemplary embodiments, the appended claims and the accompanying drawings.

BRIEF DESCRIPTION OF THE DRAWINGS

FIG. 6 is a cross-sectional end view of an exemplary conveyor belt which may be employed in a positioning conveyor system according to embodiments of the present invention.

FIG. 7 is a partial cross-sectional top view of a positioning conveyor, which is an embodiment of the positioning conveyor of FIGS. 2-4.

FIG. 8 is a partial cross-sectional top view of an exemplary positioning conveyor according to embodiments of the present invention.

FIGS. 14A through 14D2 include perspective, side, front, top, and second top views (respectively) of the example longitudinal slide support bearing of FIG. 12 depicted with the example key of FIG. 11 according to embodiments of the present invention.

DETAILED DESCRIPTION

Figure 1:
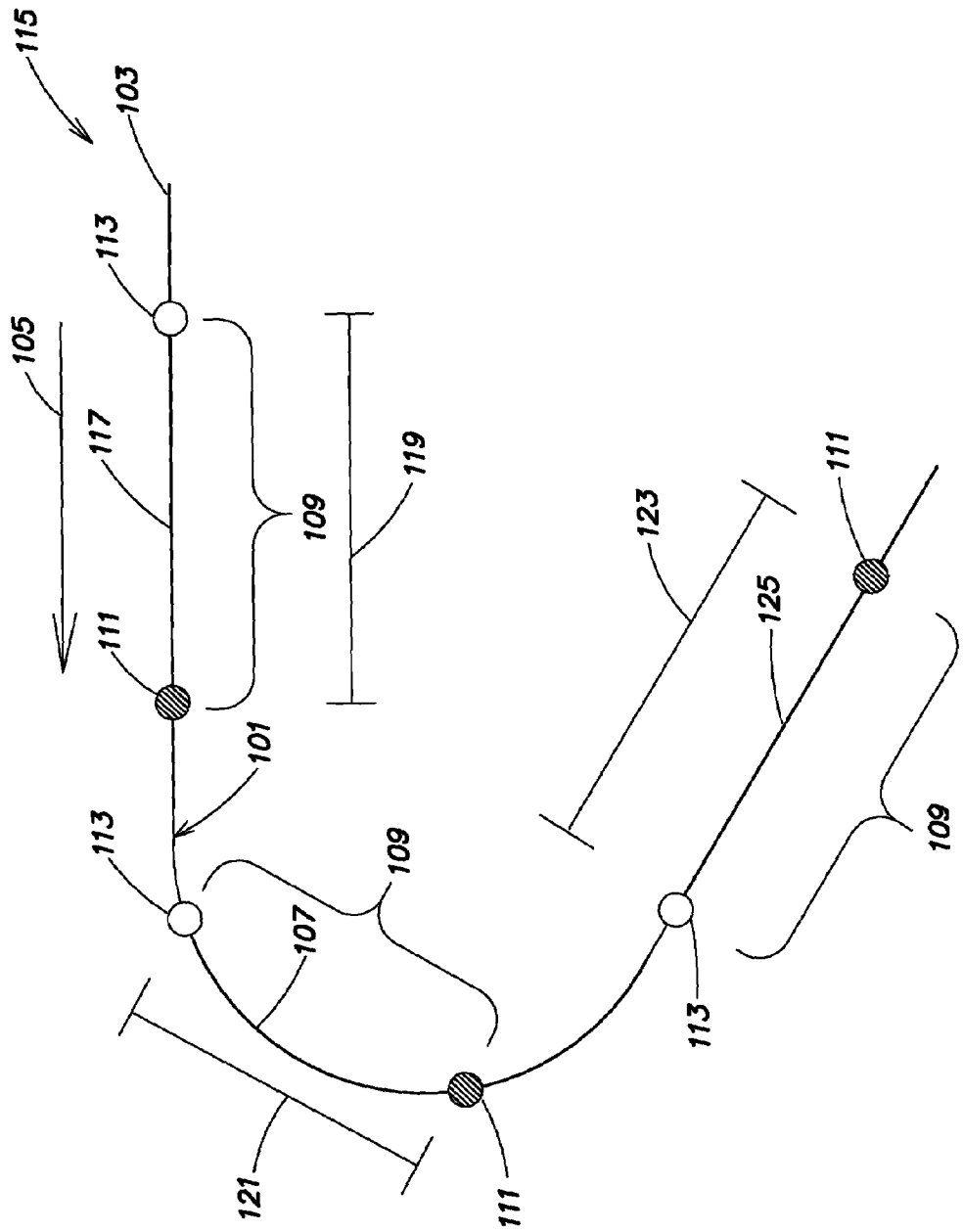
FIG. 1 is a schematic illustration of an exemplary conveyor belt which may be employed in a positioning conveyor system according to embodiments of the present invention.

Overhead transport (OHT) systems for moving substrates between processing tools within an electronic device manufacturing facility may be designed to operate continuously at high-speeds and without requiring stopping for maintenance as described, for example, in previously incorporated U.S. patent application Ser. No. 10/650,310, filed Aug. 28, 2003, and titled "System For Transporting Substrate Carriers". The conveyors used in such applications preferably are designed so that forces that may fatigue the conveyors or otherwise wear the conveyors are minimized to a level that is not appreciable (e.g. to prevent significant fatigue or wear). In addition, it is preferable to maintain the cleanliness of electronic device manufacturing facilities to minimize the possibility that substrates processed within such facilities become contaminated.

The present invention provides methods and apparatus for securely mounting a support (e.g., a cradle) for holding substrate carriers, including small lot carriers, on a conveyor belt suitable for use in an OHT system. The present invention also facilitates precise positioning of the carriers as they are transported so that processing tools and other devices may reliably locate or remove carriers being transported by the conveyor, and add carriers to the conveyor without stopping the conveyor. In addition, the support mounting methods and apparatus of the present invention minimize both the forces exerted on the conveyor and any particle generation that may result from such forces. This may be achieved in some embodiments by mounting each cradle support on the conveyor using a mount having two (or more) minimized points of contact such that both rotational and longitudinal (e.g., along the length of the conveyor) forces exerted on the mount by the conveyor as it bends (on its path through the electronic device manufacturing facility) may be accommodated by the mount while not affecting the position of the mount on the conveyor.

In some embodiments, the methods and apparatus of the present invention may employ a mount that simultaneously uses two different couplings to mount a single substrate carrier support onto a conveyor. The first coupling may accommodate rotational forces applied to the mount by the conveyor as the conveyor bends through turns on a transport path. In some embodiments, the first coupling may include a substrate carrier support bearing rigidly attached to the support and adapted to be rotatably carried by a first vertical dowel or key rigidly attached to the conveyor. The second coupling, which may employ a second vertical dowel or key rigidly attached to the conveyor, may accommodate longitudinal forces applied to the mount by the conveyor as it bends and the distance between the two keys decreases.

In one or more embodiments, the second coupling may include a support bearing, such as a longitudinal slide bearing, rigidly attached to the substrate carrier support and adapted to provide a channel within which the second vertical dowel or key rigidly attached to the conveyor is free to move longitudinally while carrying the substrate carrier support. In some embodiments, one or more additional couplings may be used for a given support.

In alternate and/or additional embodiments, the couplings may be "break-away" couplings. In other words, if the support (or a substrate carrier held by the support) unexpectedly encounters an obstruction, the couplings may be designed to controllably release the support such that the amount of force applied to the conveyor via the mount as a result of the collision is limited to a predetermined amount of break-away force that will not damage the conveyor (and/or a substrate carrier being transported by the conveyor). In some embodiments, the bearing of the first coupling may be a clip bearing that rotatably attaches to the dowel but releases the dowel if more than the predetermined amount of break-away force is applied in the longitudinal direction. Since the second coupling does not restrict the movement of the support in the longitudinal direction, the second coupling may be designed to release the support by having the slide bearing limited in length to the minimum length required to accommodate the sharpest (e.g., smallest radius) bends that the conveyor will normally be required to accommodate. Thus, mounts that use break-away couplings according to the present invention may prevent the conveyor from stopping or being damaged in the case of a collision between supports (or substrate carriers suspended from the supports) mounted on the conveyor and other objects.

As used herein, the term substrate may refer to any type of substrate, mask, reticle, other device, and/or other material that may be transported within a carrier about an electronic device manufacturing facility (e.g., a semiconductor wafer, glass plate, polymer substrate, etc.).

As used herein, the term "small lot size" carrier or "small lot" carrier may refer to a carrier that is adapted to hold significantly fewer substrates than a conventional "large lot size" carrier which typically holds thirteen or twenty-five substrates. As an example, a small lot size carrier may be adapted to hold five or less substrates. In some embodiments, other small lot size carriers may be employed (e.g., small lot size carriers that hold one, two, three, four or more than five substrates, but significantly less than that of a large lot size carrier). In general, each small lot size carrier may hold too few substrates for human transport of carriers to be viable within a semiconductor device or other manufacturing facility. Note that the present invention may employ either small lot size carriers and/or large lot size carriers.

Also, as used herein, the terms "cradle" and "support" may be synonymous and may refer to a device capable of submitting to, reacting to and/or transmitting a variety of forces, and/or of performing a variety of functions related to article conveyance. A cradle may have an extended longitudinal aspect (e.g., along the length of a straight portion of a conveyor belt), and may be subjected to drive forces (e.g., of constant and/or variable speed), as well as positive and negative acceleration, in a direction substantially aligned with its extended longitudinal dimension. Also, while being longitudinally driven (e.g., rotated) and/or accelerated, such a cradle may be subjected to vertically and/or laterally-oriented guide forces which tend to confine the longitudinally moving support to a predefined travel route and orientation. (The predefined travel route accordingly may be employed to define the transport path through which conveyed articles are moved.) In some embodiments, such a cradle may also be adapted to laterally bend (e.g., deform, flex, deflect, pivot, hinge, articulate, assume a curved aspect, and/or locally expand and/or contract as necessary) so as to conform to one or more lateral turns in the predefined travel route, as well as to straighten (e.g., reassume a substantially straight shape upon emerging from a lateral turn) so as to conform to a substantially straight segment in the predefined travel route. (When such a lateral turn exists in the travel route, the lateral turn may be considered to define a travel plane within which the cradle may be considered to be rotating.) Such a cradle is generally also employed to bear the weight of conveyed articles.

A positioning conveyor system according to the present invention may be used to orient or position a carrier relative to a processing tool or storage station. As the term is used herein, a positioning conveyor is a conveyor that includes an element such as the cradle described above, and that permits a conveyed article to assume a predefined longitudinal position relative to the cradle (i.e., a specific position along the longitudinal dimension of the cradle).

The cradle of such positioning conveyors may be required to react in a controlled fashion (e.g., without experiencing fatigue-producing stress, undue deflection, and/or undue deformation) to inertial loads arising from conveyed articles, especially inertial loads that arise as the conveyed articles pass through lateral turns in the transport path. Accordingly, the present invention provides methods and apparatus for permitting the cradle and/or cradle mounts of positioning conveyors to effectively absorb and/or accommodate inertial loads arising from conveyed articles.

As indicated above, systems for transporting substrate carriers within a electronic device fabrication facility between storage locations and processing stations, and/or between separate processing tools within a electronic device manufacturing facility, may include conveying systems wherein the conveying system additionally provides for loading and unloading of substrate carriers from the conveyor mounted supports without requiring the supports to stop, or even to slow down, during the load or unload processes. For example, such a conveying system is described in previously incorporated U.S. patent application Ser. No. 10/650,480, filed on Aug. 28, 2003 (AMAT 7676).

The above-referenced application discloses methods and apparatus for causing an end effector of a load/unload robot: (1) to substantially match a transport path of a conveyed substrate carrier (e.g., to move along a line that, as viewed from above, is aligned with a segment of a transport path along which a support or cradle of a conveyor carries a substrate carrier within a fabrication facility); (2) to substantially match a transport speed of the conveyed substrate carrier while matching the transport path (e.g., to move along the line at a speed that is equivalent to the speed at which the cradle of the conveyor carries the substrate carrier along the segment of the transport path); (3) to substantially match a moving transport position of the conveyed substrate carrier while substantially matching the transport path and the transport speed (e.g., to assume and maintain a moving position along the line that, as viewed from above, is aligned with a moving position occupied by the substrate carrier within the segment of the transport path); (4) to substantially match a transport elevation of the conveyed substrate carrier while substantially matching the transport path, the transport speed, and the moving transport position (e.g., to rise up from beneath the moving substrate carrier so as to cause mounting features of the end effector to address or engage complementary features of the substrate carrier); (5) to lift the substrate carrier off of the cradle while continuing to substantially match the transport path, the transport speed, and the moving transport position; and/or (6) to withdraw the substrate carrier (now no longer being carried by the cradle) away from the conveyor belt and out of the transport path (e.g., so as to avoid further contact with the rotating element, and to avoid any unintended contact with other moving substrate carriers, or with any other portions of the conveyor which may be moving with the cradle along the travel route).

With regard to such methods and apparatus for removing substrate carriers from a cradle, and specifically with regard to the step (3) described above, it may be advantageous for the conveying system from which the substrate carriers are to be removed to comprise a positioning conveyor, since such conveyors may be used to provide good control over the longitudinal positioning of conveyed articles. Accordingly, the present invention discloses novel methods and apparatus for providing precise positioning of conveyed articles, and includes further inventive aspects, including an aspect by which a cradle may be caused to react in an improved manner to inertial forces arising from conveyed substrate carriers, as well as an aspect by which a cradle and conveyed articles may be permitted to dislodge from a conveyor when subjected to a frontal or other impact force of a predetermined magnitude, and to do so in a controlled manner.

Terms

As such terms are used herein, the conveyor belt of a positioning conveyor includes a series of points arranged along the longitudinal dimension of the conveyor belt. Each such point, hereinafter referred to as a longitudinal location of the conveyor belt, occupies/has a predefined position along the longitudinal extent of the conveyor belt (e.g., relative to a structural component of the conveyor belt movable along the travel route), such that the predefined position of any one longitudinal location can be shown to be unique as compared to the position of all other longitudinal locations of the conveyor belt. A conveyor belt may be of any practicable shape, size, and/or orientation.

Another characteristic of the conveyor belt, is that the conveyor belt is capable of laterally bending (e.g., via flexure, hinging, pivoting, articulation, etc.) between any two such longitudinal locations so as to conform to lateral turns in the travel route. Also, as the term is used herein, longitudinal location may refer to multiple points on the conveyor belt having the same longitudinal position relative thereto (e.g., wherein the multiple points form an axis and/or a plane, and/or wherein the axis or plane remains in a normal orientation relative to the local direction of the conveyor belt's travel route). For example, a physical datum feature or datum surface (e.g., a mounting through hole, a threaded mounting bore hole, a mounting post, a mounting surface, a dowel, etc.) formed on or within the conveyor belt, and/or fixedly attached relative to the longitudinal dimension of the conveyor belt, may resolve to a point, an axis, and/or a plane that partially or completely defines a longitudinal location of the conveyor belt. Accordingly, the point, axis, or plane to which such a datum feature or surface resolves need not necessarily intersect a physical structural element of the conveyor belt (e.g., the longitudinal location may correspond to the resolved axis of a through hole passing through a structural element of the conveyor belt and having a perpendicular orientation relative to the travel route thereof). Still further, the term longitudinal location may refer to other points or positions not specifically described above but which may be shown to be consistent with the present use of the term.

Not every point along the longitudinal dimension of a given conveyor belt may be properly encompassed within the term longitudinal location. For example, if the conveyor belt is comprised of a longitudinally arranged series of links or segments, wherein the links or segments themselves are substantially laterally inflexible (e.g., the links cannot be made to bend away from a direction of longitudinal extension to any significant extent), but the conveyor belt is otherwise capable of forming the required lateral bend at or along one or more points of articulation between such links (e.g., via flexible contact or non-contact couplings between the links), in at least one embodiment, no more than one longitudinal location may be associated with each such link.

Conversely, other conveyor belts may comprise a theoretically potentially infinite number of distinct longitudinal locations. For example, a conveyor belt may comprise at least one longitudinally-elongated structural component (and/or a longitudinally arranged series of such components) having a unitary (e.g., continuous) construction in its longitudinal direction of extension that permits the component to exhibit overall dimensional stability in the longitudinal direction (e.g., the component is both substantially incompressible and substantially inextensible therealong), while at the same time permitting the component to locally flex at essentially any point along its length so as to permit substantial conformance to the shape of lateral turns in the travel route (some embodiments of such a conveyor belt may comprise a ribbon or band (e.g., formed from or made of a material such as spring stainless steel, polycarbonate, composite materials (e.g., carbon graphite, fiberglass, etc.), steel or otherwise reinforced polyurethane, polypropylene, epoxy laminates, plastic or polymer materials that include stainless steel, fabric (e.g., carbon fiber, fiberglass, Kevlar® available from Dupont, polyethylene, steel mesh, etc.) or another stiffening material, etc.) joined at its opposite ends to form a closed loop coinciding with the travel route). A succession of very closely spaced longitudinal locations may be imagined with regard to such a conveyor belt, since no matter how small the distance between two longitudinally distinct points along the length of the conveyor belt, it is always possible to imagine the existence of an additional point or points between the two longitudinally distinct points at or along which the conveyor belt may form a bend (however slight).

Problem to be Solved

The notion of longitudinal locations having been at least initially discussed with regard to different types of conveyor belts, it may be now be considered that the interface between a conveyor belt and a conveyed article may be an important part of a system that seeks to provide positioning of conveyed articles in an accurate, precise, and/or repeatable manner, e.g., so as to facilitate smooth unloading of conveyed articles as described above. FIG. 1 schematically illustrates an exemplary conveyor belt which may be employed in the context of an inventive positioning conveyor system. An analysis of the conveyor belt of FIG. 1 may illustrate potential complications related to precise positioning of conveyed articles. For example, and as will now be explained, one necessary result of the requirement that the conveyor belt be capable of bending between any two longitudinal locations is that the absolute distance between any two longitudinal locations, such as may be measured within a travel plane defined by such a bend in the travel route, is capable of variation (e.g., depending on whether at any given time a bend in the conveyor belt exists between such longitudinal locations).

FIG. 1 schematically illustrates an exemplary conveyor belt 101, in that it shows the travel route 103 along which the conveyor belt 101 may be caused to rotate in a longitudinal direction 105, and within which it is confined. The travel route 103 forms a travel plane (coplanar with the plane of the paper of FIG. 1) via the presence of a lateral turn 107 in the travel route. The conveyor belt 101 is dimensionally stable along its longitudinal dimension (i.e., the conveyor belt 101 as a whole is neither compressible nor extensible to any significant extent along the travel route 103). The conveyor belt includes an exemplary portion 109 on which is located a first longitudinal location 111, and a second longitudinal location 113 located relatively near the first point on the exemplary portion 109, and upstream of the first point relative to the direction of travel 105. The conveyor belt 101 is a part of a positioning conveyor 115 (not separately shown), and it shall be initially considered that a conveyed article (not shown) is to assume a predefined longitudinal position relative to the conveyor belt 101, at least in part via longitudinal positional guidance provided by the conveyor belt 101 at both the first and second longitudinal locations 111, 113 (e.g., the conveyed article is to simultaneously longitudinally locate on both such longitudinal locations).

While the exemplary portion 109 of the conveyor belt 101 passes along a first substantially straight segment 117 of the travel route 103, the first and second longitudinal locations 111, 113 will remain separated by a distance represented by a first dimension 119 (as measured within the travel plane) which will tend to remain essentially constant. By contrast, the distance between the first and second longitudinal locations 111, 113 will foreshorten to a second, smaller distance represented by a second dimension 121 whenever the exemplary portion 109 of the conveyor belt 101 is passing through the turn 107 in the travel route 103. Further, and as is also shown in FIG. 1, the original point-to-point distance may be restored, as represented by a third dimension 123 which is equivalent to the first dimension 119, once the exemplary portion 109 of the conveyor belt 101 emerges from the turn 107 and is passing, for example, along a second substantially straight segment 125 adjacent the turn 107.

Since the absolute distance between the first and second longitudinal locations 111, 113 will tend to vary depending on whether the longitudinal locations 111, 113 are passing along a straight or curved segment of the travel route, to attempt to cause the conveyed article (not shown) to simultaneously locate on both such points on the conveyor belt 101 may invite one or more of the following complications:

(1) an ambiguity as to the true longitudinal position of the conveyed article (not shown) relative to the conveyor belt 101;

(2) problems related to achieving consistent and precise spatial orientations (e.g., as distinct from maintaining a consistent longitudinal position) for all conveyed articles (not shown); and/or (3) one or more instances of mechanical interference which may potentially damage or deform the conveyor belt 101, the conveyed article (not shown), or other apparatus (not shown) related to providing support for the conveyed article.

As such, at least for purposes of establishing a precise longitudinal position for a conveyed article relative to the conveyor belt of a positioning conveyor, it may be advantageous to predetermine/preselect a longitudinal location on which the conveyed article is to locate, rather than to rely on multiple longitudinal locations for purposes of longitudinal positioning. Moreover, the advantages inherent in the use of a longitudinal location for longitudinal positioning may persist regardless of whether the conveyor belt is generally dimensionally stable in the longitudinal dimension (as illustrated in FIG. 1. and described above with regard to FIG. 1), or is not necessarily characterized by dimensional stability in the longitudinal dimension (e.g., wherein the conveyor belt may be relatively compressible and/or extensible in the direction of the travel route, and/or may exhibit backlash between longitudinally adjacent but structurally separate links, segments, or components which comprise the conveyor belt).

Figure 2:
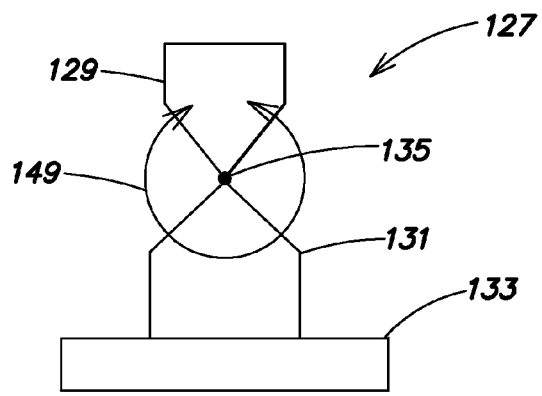
FIG. 2 is a schematic end view of an exemplary conveyor belt which may be employed in a positioning conveyor system according to embodiments of the present invention.
Figure 3:
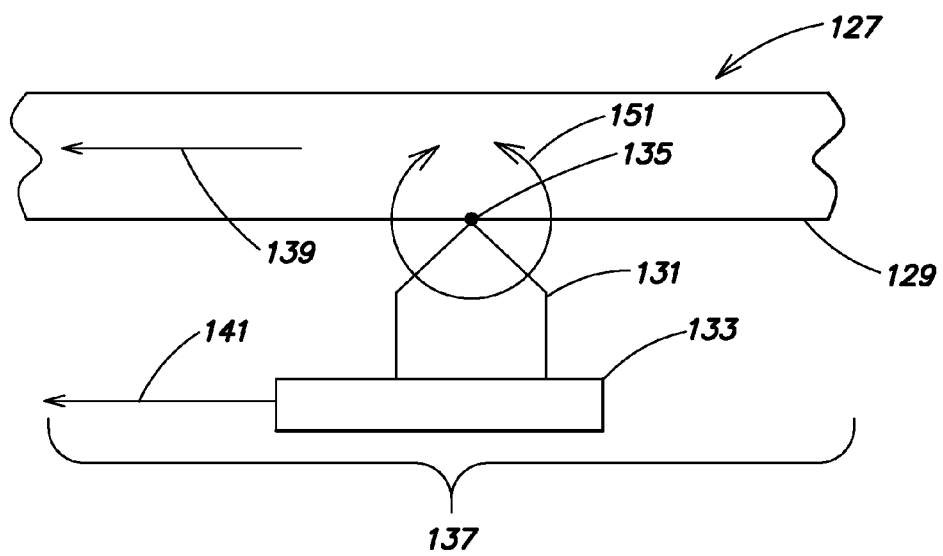
FIG. 3 is a schematic side view of an exemplary conveyor belt which may be employed in a positioning conveyor system according to embodiments of the present invention.
Figure 4:
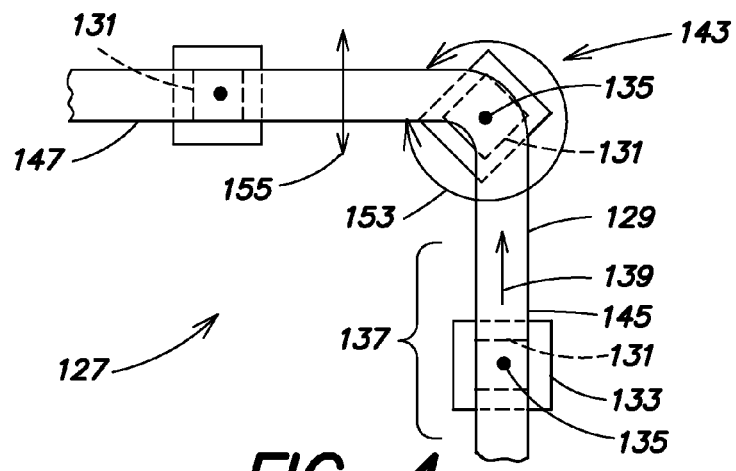
FIG. 4 is a schematic top view of an exemplary conveyor belt which may be employed in a positioning conveyor system according to embodiments of the present invention.

FIGS. 2 through 4 presuppose that such a positioning conveyor may include article positioning supports interposed between conveyed substrate carriers and the rotating element, wherein a first end of each article support permits a substrate carrier to be received by and to become positively longitudinally located relative to the article support, and a second end of each article support permits the article support to locate on a predefined longitudinal location of the conveyor belt.

FIG. 2 is a schematic end view of a positioning conveyor 127 in accordance with the present invention which may be similar to the positioning conveyor 115 described above with regard to FIG. 1, except insofar as the positioning conveyor 127 includes a conveyor belt 129 that is not necessarily characterized by dimensional stability in the longitudinal dimension as is the conveyor belt 101 of FIG. 1, and may have further characteristics such as are described below. The positioning conveyor 127 further comprises an article support 131 (e.g., the positioning conveyor 127 may comprise multiple instances of such an article support 131). The article support 131 receives and supports a substrate carrier 133 in a manner that permits the substrate carrier 133 to positively locate on the article support 131, e.g., in the longitudinal direction (i.e., into the plane of FIG. 2). The article support 131, in attaching to the conveyor belt 129, precisely longitudinally locates on a longitudinal location 135 of the conveyor belt 129, which longitudinal location 135 may be considered essentially equivalent to the longitudinal location 111 of FIG. 1. As such, a measure of the precision with which the article support 131 longitudinally locates relative to the conveyor belt 129 may be 'passed on' to the conveyed substrate carrier 133 (e.g., to a greater or lesser degree depending on the relevant properties of the article support 131, (such as stiffness, presence of articulation, degree of articulation, etc. and/or the manner in which the spatial orientation of the article support 131 relative to the conveyor belt 129 is controlled).

FIG. 3 is a schematic side view of a portion 137 of the conveyor belt 129 of the positioning conveyor 127 of FIG. 2, including the article support 131, which is longitudinally located on the longitudinal location 135 of the conveyor belt 129, and the conveyed substrate carrier 133, which is supported by and is longitudinally located relative to the article support 131. The portion 137 of the conveyor belt 129 may be caused to pass along a substantially straight segment of a travel route 139 of the conveyor belt 129, thereby causing the conveyed substrate carrier 133 to be moved along a transport path 141.

FIG. 4 is a schematic top view of the positioning conveyor 127 of FIG. 2, corresponding to a curved segment 143 of the conveyor belt's travel route 139 disposed between a first and a second substantially straight segment 145, 147 thereof. The article support 131, because it is longitudinally located on the longitudinal location 135 of the conveyor belt 129, may be caused to travel with the conveyor belt 129 along the travel route 139, e.g., as the conveyor belt 129 passes through the first substantially straight segment 145, enters and bends in conformance with the curved segment 143, and enters and straightens within the second substantially straight segment 147. The substrate conveyor 133, longitudinally located relative to the article support 131, is also generally considered to be longitudinally located on the longitudinal location 135 by virtue of the article support 131 being so located.

FIGS. 2, 3 and 4 further respectively illustrate that the conveyor belt 129 may be subjected to inertial forces arising within the conveyed substrate carrier 133, and/or within a subassembly comprising the conveyed substrate carrier 133 and the article support 131, and transmitted by the article support 131 in the form of one or more moments 149, 151, 153 respectively in roll, pitch, and/or yaw. Further, each of FIGS. 2, 3 and 4 illustrate that, in such particular embodiments of the positioning conveyor 127 wherein force-transmission interaction between the article support 131 and the conveyor belt 129 is intentionally confined to the longitudinal location 135 and/or the area of the conveyor belt 129 immediately adjacent the longitudinal location 135, any or all of the above-mentioned moments will tend to act on the conveyor belt 129 in a focused manner, converging on the same longitudinal location, i.e., longitudinal location 135, requiring the conveyor belt 129 to react accordingly. For example, to the extent the attachment of the article support 131 to the conveyor belt 129 includes limitations or restrictions in the capacity of the article support 131 to rotate relative to (e.g., rotate or swing about) the longitudinal location 135, the article support 131 may be caused to act in the manner of a cantilever extending from the conveyor belt 129 to the degree of an offset between the longitudinal location 135 and the center of gravity of the conveyed substrate carrier 133, and/or of the substrate carrier/article support subassembly. Inertial forces arising within the conveyed substrate carrier 133, because acting through a cantilever support, may then be passed on to the conveyor belt 129 in the form of the moment 149 in roll (FIG. 2), the moment 151 in pitch (FIG. 3), and/or the moment 153 in yaw (FIG. 4), depending on the nature and/or degree (e.g., complete or partial) of the restraint.

As relates to the discussion of FIG. 5 below, the attachment of the article support 131 to the conveyor belt 129 may, for example, incorporate means to enforce a substantially complete restriction in the capacity of the article support 131 to rotate laterally, i.e., in yaw (see the yaw moment 153 of FIG. 4). For example, a pair of complementary and mating cylindrical or spherical datum surfaces (not shown) of an interface apparatus (not shown) may be located at the longitudinal location 135. One of the pair of datum surfaces may have a fixed spatial and positional (e.g., fixed in a horizontal plane) relationship with the conveyor belt 129, and the other may have the same relationship with the article support 131. By carefully 'positioning' the datum surfaces relative to one another, an operator may adjust the yaw orientation of the article support 131 so as to cause the article support 131 to become longitudinally aligned with the conveyor belt 129, and by virtue of such alignment, to become longitudinally aligned as well with the travel route 139 within which the conveyor belt 129 is confined as it rotates longitudinally. Once the article support 131 has been brought into such an aligned condition in yaw, the rotational orientation of the datum surfaces relative to one another may be fixed, such that the article support may be caused to remain in the aligned condition.

Certain embodiments of the positioning conveyor 127 which, as discussed earlier, restrict interaction between the article support 131 and the conveyor belt 129 to the longitudinal location 135, may permit the aligned condition of the article support 131 in yaw relative to the travel route 139, described immediately above, to persist, whether at any given time the article support 131 is passing through a turn in the travel route (see the turn 143 of FIG. 4), or through a substantially straight segment of the travel route (see the first and second substantially straight segments 145, 147 of FIG. 4). As such, all other variables being considered to be equal, methods and apparatus for removing the conveyed substrate carrier 133 from the conveyor belt 129 while the conveyor belt 129 is moving, and that require the conveyed substrate carrier 133 to assume, and remain in an aligned (or, alternatively, a fixedly offset) yaw orientation relative to the travel route 139 during removal, may be accommodated with equal facility along either turns or substantially straight segments in the travel route 139.

Referring again to FIGS. 2-4, one or more specific embodiments of the conveyor belt 129 may be, for example, of a uniformly (e.g., along the longitudinal dimension) relatively light weight so as to permit high rotational speeds through turns without inviting the potential for unmanageable inertial forces arising within affected portions of the conveyor belt 129 itself, and/or of a high aspect ratio (such as the vertically-oriented ribbon-type version described above) so as to facilitate precise application of laterally-oriented guide forces and to enable the conveyor belt 129 to conform to lateral bends in the transport path. As such, at least one dimension of the conveyor belt 129 at the longitudinal location 135 (e.g., a thickness of a continuous ribbon formed by the conveyor belt, or a thickness of a link or segment of the conveyor belt) may be smaller than if the more important design criteria were a desire to avoid fatigue-producing stress, and/or plastic deformation, within the conveyor belt 129 in response to one or more large transmitted inertial moments from the substrate carrier 133, or from the substrate carrier/article support subassembly.

For example, a given embodiment of the conveyor belt 129 may be optimized in the manner described above (e.g., as to weight, capacity to be precisely laterally and/or vertically guided, and capacity to precisely conform to lateral turns in the travel route 139 (FIG. 4)), resulting in a relatively small thickness dimension at the longitudinal location 135 in a direction 155 that runs transverse or perpendicular to the travel route 139 (FIG. 4). Also, the given embodiment may also limit force transmission interaction between the article support 131 and the conveyor belt 129 to the longitudinal location or the immediate vicinity thereof. However, transport circumstances may arise, for example, in which such a conveyor belt 129 will be called upon to react to a roll moment 149 (e.g., which may be applied periodically, i.e., each time the conveyed substrate carrier 133 passes through a portion of the transport path 141 (FIG. 3) corresponding to the turn segment 143 (FIG. 4) of the travel route 139) which is disproportionately large. This invites the possibility of premature damage to the conveyor belt 129 at or in the immediate vicinity of the longitudinal location 135. Such damage may occur, for example, either immediately (e.g., plastic deformation), or over time (e.g., cracks which are created by, and thereafter propagated by, fatigue from regularly high stress levels).

Depending on the transport application, the variables of the following list, may be relevant to whether such a conveyor belt 129 sustains premature damage due to inertial loading in yaw, pitch, or roll, and especially in roll (e.g., such as may arise when a conveyed substrate carrier 133 passes through turns in the transport path 141 (FIG. 3) as defined by similar turns in the travel route 139 (FIG. 4) of the conveyor belt):

(1) the basic inertia of the substrate carrier 133 (which may be relatively high, e.g., in the case of a FOUP adapted to store 25 or more substrates) and/or of the substrate carrier/article support subassembly;

(2) the local stiffness and/or strength of the conveyor belt 129 (which may be relatively low, e.g., because of the design considerations mentioned above);

(3) the overall stiffness and/or strength of the article support 131 (which may be limited in cross-sectional size near the conveyor belt because the footprint of a force transmission interface with the conveyor belt 129 is limited to the longitudinal location 135);

(4) the speed at which the conveyor belt 129 is rotated along the travel route 139;

(5) the frequency with which the inertial load is applied (which may be relatively high, due to a high rotation speed and/or the presence of many lateral turns in the travel route 139);

(6) the relative size of the radii describing turns in the travel route 139 (e.g., in the case of turns with variable radii, an instantaneous radius value, and in the case of turns with constant radii, the value of that constant radius);

(7) the total number of substrates which the conveyed substrate carrier 133 is capable of storing, as well as the number of substrates stored in a particular conveyed substrate carrier 133, and the load configuration of any conveyed substrate carrier 133 containing less than a full complement of stored substrates; and/or (8) the 'cantilever' distance separating a center of gravity of the conveyed substrate carrier 133, and/or a resolved center of gravity of a substrate carrier/article support subassembly, from the longitudinal location 135 (e.g., the longitudinal (in the case of a yaw moment) and/or vertical (in the case of pitch and roll moments) offset between the center of gravity of the inertial body and the longitudinal location 135).

An embodiment of the conveyor belt 129 that is caused to bear, at the same longitudinal location at which the article support 131 locates, the entirety of all inertial loads arising within the conveyed substrate carrier 133, or within the substrate carrier/article support subassembly, may tend to form life-shortening cracks and/or undue elastic or plastic deformation either precisely at the longitudinal location 135, or within an area of the conveyor belt 129 immediately adjacent and/or surrounding the longitudinal location 135.

The consequences of such damage to the conveyor belt 129 may have the effect of preventing smooth removal of the conveyed substrate carrier 133 from the moving conveyor belt 129, especially in circumstances in which the conveyor belt 129 must maintain a constant, high speed of rotation along the travel route 139. As such, methods and apparatus are needed to permit a conveyor belt 129 to avoid life-shortening levels of stress at the longitudinal location 135 at which the article support 131 locates, while at the same time reliably reacting (e.g., reacting in a well-controlled manner) to inertial loads arising within the conveyed substrate carriers 133 and/or the substrate carrier/article support subassembly, and continuing to exert precise control over the longitudinal position and spatial orientation of the article support 131 for purposes of smooth at-speed unloading of the substrate carrier 133.

Description of Specific Embodiments of the Invention

Figure 5:
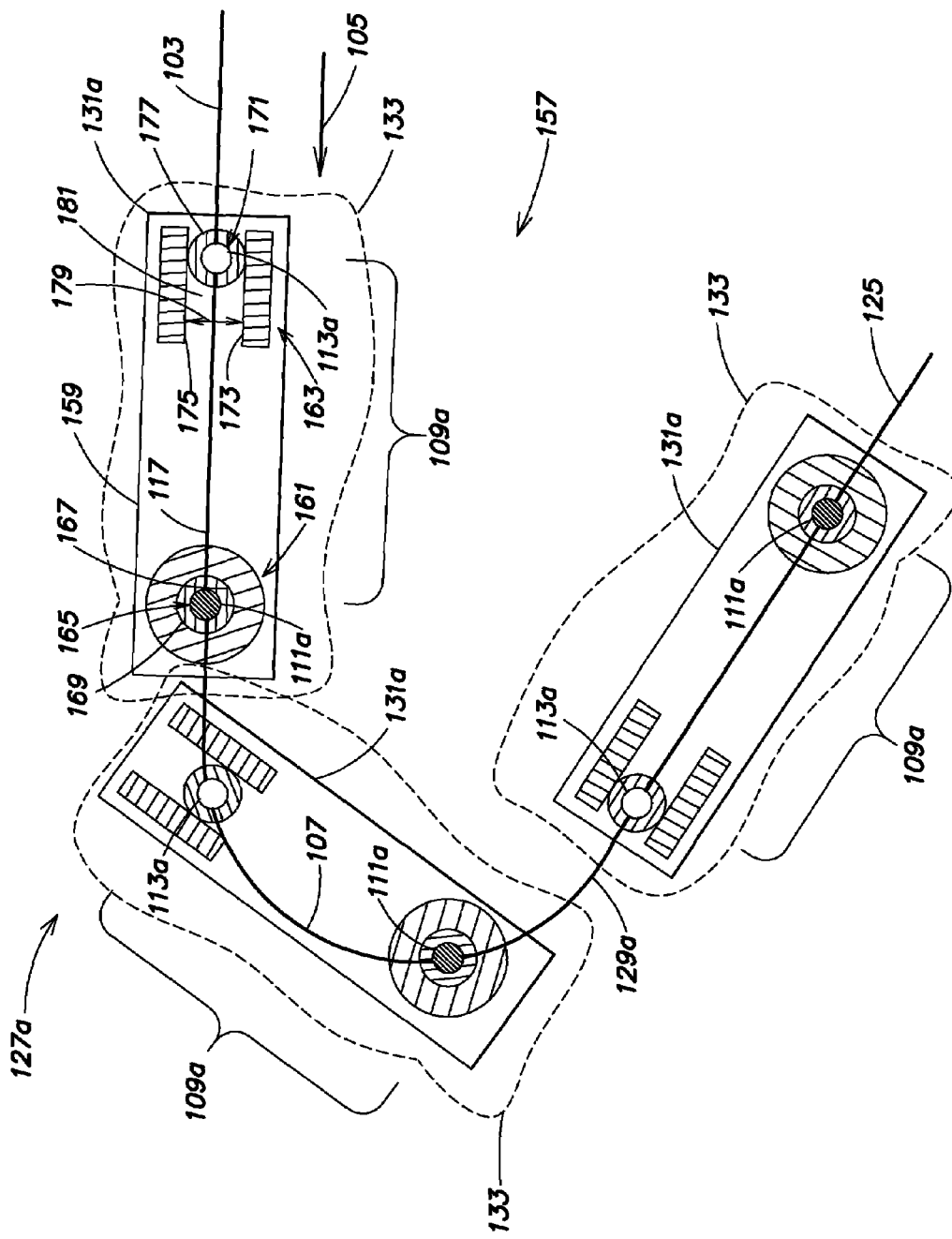
FIG. 5 is a partial top view of an exemplary positioning conveyor system according to embodiments of the present invention.

FIG. 5 is a partial top view of a positioning conveyor system 157 in accordance with the present invention for transporting substrates within a fabrication facility. Referring to FIG. 5, the positioning conveyor system 157 includes a substrate carrier 133 (shown in phantom) (the positioning conveyor system 157 may include multiple instances of such a substrate carrier 133), and a positioning conveyor 127a adapted to move the substrate carrier 133 along a transport path (not separately shown-see the transport path 141 of FIG. 3)). The positioning conveyor 127a includes, in the form of a conveyor belt 129a, an embodiment of the conveyor belt 129 of FIGS. 2-4 which has such additional features as are described below, including (like the conveyor belt 101 of FIG. 1) dimensional stability along the longitudinal dimension of the conveyor belt 129a. The conveyor belt 129a is schematically illustrated in FIG. 5 in that FIG. 5 shows the travel route 103 along which the conveyor belt 129a may be rotated in a longitudinal direction 105, and within which it may be confined by vertical and/or lateral guide equipment (not shown). The travel route 103 forms a travel plane (coinciding with the plane of the paper of FIG. 5) via the presence of a lateral turn 107 in the travel route 103. The conveyor belt 129a includes a portion 109a on which is located a first longitudinal location 111a, and a second longitudinal location 113a located relatively near the first location on the a portion 109a, and upstream of the first location relative to the direction of travel 105.

Importantly, the positioning conveyor 127a also includes an article support 131a, similar to the article support 131 described above, and having specific features as described below, among which are features by which inertial loads arising from the conveyed substrate carrier 133, or from the substrate carrier/article support subassembly (which are transmitted by the article support 131a to the conveyor belt 129a in the form of moments such as the roll moment 149 of FIG. 2 and/or the yaw moment 153 of FIG. 4) may be distributed among multiple longitudinal locations of the conveyor belt 129a. For example, the article support 131a may include a support element 159, from which the conveyed substrate carrier 133 may be made to depend, as well as a first and a second interface portion 161, 163 (both shown in cross section), which may be coupled to the support element 159, and/or of unitary construction with the support element 159 (hinging arrangements are also possible), such that the first and second interface portions 161, 163 extend upward from the support element 159, and occupy positions on the support element 159 separated by a predefined generally fixed distance (e.g., the distance, though generally fixed, may or may not be adjustable in length). The first and second interface portions 161, 163 are adapted to interact in a coordinated fashion with the conveyor belt 129a so as to distribute the above-described inertial loads between the first and second longitudinal locations 111a, 113a.

The first interface portion 161 is adapted to longitudinally and laterally locate on the first longitudinal location 111a (and by doing so, to longitudinally and laterally locate the article support 131a relative to the conveyor belt 129a) in a manner that permits the article support 131a to transmit inertial loads in the form of roll and pitch moments to the conveyor belt 129a via the longitudinal location 111a while permitting the article support 131a to rotate to some degree in yaw about the first longitudinal location 111a (i.e., wherein the first longitudinal location 111a may be located at the center of rotation of the article support 131a). As such the spatial orientation of the article support 131a is not completely fixed in yaw relative to the conveyor belt 129a, as was the case for certain embodiments of the conveyor belt 129 discussed above with regard to FIGS. 2-4.

The second interface portion 163 is adapted to laterally locate on the second longitudinal location 113a of the conveyor belt 129a in a manner that permits the article support 131a to transmit inertial moments in roll to the conveyor belt 129a at the second longitudinal location 113a without interfering with the longitudinal and lateral locating function of the first interface portion 161 by which the article support 131a derives its longitudinal location relative to the conveyor belt 129a. Employment of the article support 131a may thus avoid, among other potential complications, the complications (1)-(3) described above with regard to FIG. 1 having to do with positional ambiguity, mechanical interference, etc., while distributing potentially damaging inertial loads along multiple longitudinal locations so as to reduce the potential for localized fatigue due to high stress levels, and/or localized instances of undue flexure in the conveyor belt 129a.

As the embodiment of the article support 131a shown in FIG. 5 illustrates, the conveyor belt 129a may comprise a first mounting feature 165 (shown in cross section), longitudinally and laterally located on the first longitudinal location lila for interacting with the first interface portion 161 of the article support 131a. For example, part or all of the first mounting feature 169 of the conveyor belt 129a may be of unitary construction with a link (not shown) of the conveyor belt 129a. Alternatively, or additionally, the first mounting feature 169 may comprise one or more components separate from the conveyor belt 129a and coupled to the conveyor belt 129a at the first longitudinal location 111a.

The first interface portion 161 of the article support 131a and the first mounting feature 165 of the conveyor belt may respectively comprise a first datum surface 167 and a second datum surface 169. The first and second datum surfaces 167, 169 may comprise complementary locating features positioned substantially coaxially and/or concentrically and adapted to slidably mate so as to permit relative rotation between the two surfaces while the two surfaces are maintained in contact and/or in close proximity for purposes of good locating precision. For example, lateral (e.g., parallel to the paper of FIG. 5) cross sections of the first and second datum surfaces 167, 169 may describe partial circles (i.e. one, two or more circle segments) and/or complete circles, and the first and second datum surfaces 167, 169 themselves may describe complementary partial or complete spherical, conical, cylindrical, and/or otherwise complementary curved or undulatory shapes so as to facilitate relative rotation.

The circular cross-sections of either or both of the first or second datum surfaces 167, 169 need not necessarily form complete circles, at least since complete (i.e., 360 degree) rotation of either surface relative to the other need not necessarily be provided. Circular segments of differing radii are also possible, provided all such segments are concentric so as to facilitate simultaneous longitudinal and lateral location of the article support 131a relative to the conveyor belt 129a.

In cases where the second datum surface 169 forms a spherical shape, the second datum surface 169 may resolve to a point (not shown) which may coincide with the longitudinal location 111a. Also, in cases where the second datum surface 169 resolves to an axis (not shown) (e.g., when the datum surface 169 forms a cylinder, a cone, a curved or undulatory shape, etc.), the axis to which the second datum surface 169 resolves may or may not coincide with the longitudinal location 111a. If the point or axis to which the second datum surface 169 resolves does not coincide with the longitudinal location 135, a substantially fixed offset may separate the point or axis from the longitudinal location 135 in the longitudinal and/or lateral direction. Coincident or nearly coincident arrangements in such circumstances may be advantageous in that they may best serve to limit the overall magnitude of transmitted inertial moments.

As the embodiment of the article support 131a shown in FIG. 5 also illustrates, the conveyor belt 129a may comprise a second mounting feature 171 located at the second longitudinal location 113a for interacting with the second interface portion 163 of the article support 131a. For example, part or all of the second mounting feature 171 of the conveyor belt 129a may be of unitary construction with the conveyor belt 129a. Alternatively or additionally, the second mounting feature 171 may comprise one or more components separate from the conveyor belt 129a and coupled to the conveyor belt 129a at the second longitudinal location 113a.

The second interface portion 163 of the article support 131a may comprise separate third and fourth datum surfaces 173, 175, spaced apart from each other and facing generally toward each other (e.g., if subjected to coordinated controlled dimensional tolerancing, they may be considered to resolve together to an axis, or a plane disposed between them, as described further below), and the second mounting feature 171 of the conveyor belt 129a may comprise a fifth datum surface 177. The third and fourth datum surfaces 173, 175 may be individually adapted (e.g., not necessarily simultaneously) to slidably mate with the fifth datum surface 177 in a manner that permits both translational and rotational motion between pairs of contacting surfaces without loss of contact, or if contact is broken, without loss of close proximity. For example, a lateral (e.g., parallel to the paper of FIG. 5) cross section cutting through the third and fourth datum surfaces 173, 175 may describe two lines which are both straight and parallel to each other and separated by a predefined distance 179, and a lateral cross section of the fifth datum surface 177 may describe a partial or complete circle of a diameter slightly smaller than a distance 179 between the two straight and parallel lines, or may form two or more circular segments of the same or differing radii which sum to a total distance slightly smaller than the distance 179. Either or both of the third and fourth datum surfaces 173, 175 themselves may be substantially planar (e.g., if both planar, they may be substantially parallel to each other), and/or may form the shape of a curved and/or undulatory line extruded in space in the longitudinal direction. The third and fourth datum surfaces 173, 175, though they may extend in the same generally longitudinal direction, may or may not be bilaterally symmetrical across a lateral vertically-oriented cross section as viewed in that direction, so long as in lateral horizontally-oriented cross section, the datum surfaces 173, 175 appear as substantially parallel lines (as they do in FIG. 5).

The second mounting feature 171 may remain at all times laterally (i.e., transversely relative to the longitudinal direction of travel 105) 'captured' between the third and fourth datum surfaces 173, 175 of the second interface portion 163 of the article support 131a (e.g., simultaneously remaining either in contact with and/or in close proximity to each of the third and fourth datum surfaces 173, 175), while being free to rotate to some degree relative to the second interface portion 163 generally (and the third and fourth datum surfaces 173, 175 in particular), and/or translate to some degree in a generally longitudinal direction along a slot 181 formed by the opposing third and fourth datum surfaces 173, 175. In some embodiments of the second interface portion 163, the third and fourth datum surfaces 173, 175, e.g., to the extent they are considered bilaterally symmetrical about a central plane or axis (not separately shown), may be considered to resolve to a central plane or axis. Such a central plane or axis may define a longitudinal direction of the slot 181, and may or may not coincide with non-planar embodiments of the second longitudinal location 113a.

Consistent with the above-described functions of the positioning conveyor 127a, embodiments of the positioning conveyor 127a may be provided in which either or both of the first or second mounting features 165, 171 also bear the weight of the conveyed substrate carrier 133 and/or the substrate carrier/article support subassembly. For example, the first and/or second mounting features 165, 171 may feature outside diameters which taper in a linear manner (e.g., conically) and/or in a non-linear manner (e.g., with a convex or concave aspect) from lower to higher portions thereof (not separately shown), and inside diameters (e.g., in the case of the first interface portion 161) or a surface-to-surface spacing dimension (e.g., in the case of the second interface portion 163) of the corresponding interface portion may be similarly tapered so as to permit the interface portion to settle atop the mounting feature. In such an arrangement, the height of the article support 131a may also be set at least partially via such weight-bearing interaction between one or more pairs of corresponding datum surfaces of the mounting features of the rotating element 129a and the interface portions of the article support 131a such that the article support 131 may vertically locate relative to the conveyor belt 129a. Alternatively, and as will be described below, the corresponding datum surfaces may not perform weight bearing and/or vertical location functions, and such functions may be performed by separate elements and/or features (e.g., which may also comprise part of the mounting features and/or the interface portions) not necessarily involved in longitudinal and/or lateral location of the article support 131a relative to the conveyor belt 129a.

FIG. 5 provides sequential illustrations of the a portion 109a of the conveyor belt 129a passing (1) along a first substantially straight segment 117 of the travel route 103, (2) along the turn 107 of the travel route 103, and (3) along a second substantially straight segment 125 of the travel route 103. In a similar manner as is shown and described above with reference to FIG. 1, the absolute distance between the first and second longitudinal locations 111a, 113a may foreshorten within the turn 107, and be restored within the second substantially straight segment 125. The laterally locating interface between the second mounting feature 171 of the conveyor belt 129a and the second interface portion 163 of the article support 131a may account for this foreshortening and restoration by permitting the second mounting feature 171 to advance or retreat within the slot 181 of the second interface portion 163 as necessary. For example, after the first longitudinal location 111a has entered the turn 107, but while the second longitudinal location 113a remains in the first substantially straight segment 117, the second mounting feature 171 may be required to advance within the slot 181, as may be seen by comparing the first and second instances of the exemplary portion 109 of the conveyor belt 129a shown in FIG. 5. As another example, after the first longitudinal location 111a has exited the turn 107, but while the second longitudinal location 113a remains in the turn 107, the second longitudinal location 113a may be required to retreat within the slot 181, as may be seen by comparing the second and third instances of the exemplary portion 109 of the conveyor belt 129a shown in FIG. 5. Presuming the second interface portion 163 of the article support 131a to be of sufficient length, the second interface portion 163 may keep the second interface portion 163 captive regardless of the relative position of the second longitudinal location 113a within the slot 181 (e.g., wherein tighter turns may necessitate a relatively greater minimum length for the second interface portion 163).

The positioning conveyor 127a of FIG. 5 may be optimized so as to provide precise alignment of the article support 131a in yaw relative to the conveyor belt 129a along the substantially straight segments 117, 125. In this way, it may be used to advantage in conjunction with equipment designed to unload substrate carriers as they move along a straight transport path, such as the load/unload robot described in the above incorporated 480 Patent Application. For example, the first and second datum surfaces 167, 169 may be cylindrical in shape, and of sufficient length so as to provide precise overall pitch and roll orientation for the article support 131a and the conveyed substrate carrier 133. The axis to which the cylindrically shaped second datum surface 169 resolves may be controlled so as to pass substantially vertically through the longitudinal location 111a, which enables the article support 131a and the conveyed substrate carrier 133 to locate both longitudinally and laterally on the longitudinal location 111a. Precise yaw orientation for the article support 131a relative to the travel route 103 may accordingly be provided by causing the article support 131a to become longitudinally aligned with the conveyor belt 129a.

At least three aspects of the article support 131a may cooperatively act to provide such longitudinal alignment. In a first aspect, although the capacity of the first interface portion 161 of the article support 131a to rotate about the first mounting feature 165 essentially forgoes the possibility of positive longitudinal alignment at all points on the travel route 103, it permits the flexibility needed to permit the first and second mounting features 165, 171 of the conveyor belt 129a to rotate relative to each other. Such flexibility is needed, for example, to the extent the specific yaw orientation of each of the first and second mounting features 165, 171 of the conveyor belt 129a is fixed relative to the local tangential direction of travel of the conveyor belt 129a (see FIG. 5, in which the direction of the cross-hatching of each mounting feature 165, 171 remains aligned with the local direction of the travel route 103, resulting in a difference in yaw orientation as between the two mounting features 165, 171 while both are passing through the turn 107).

In a second aspect, the second interface portion 163 of the article support 131, by means of its lateral locating and longitudinally translating relationship with the second longitudinal location 113a (e.g., via the second mounting feature 171), permits the second mounting feature 171 to rotate the article support 131a relative to (i.e., about) the first longitudinal location 111a so as to provide the desired yaw value. As such, to the extent the conveyor belt 129a is made to assume a substantially straight shape, the first and second longitudinal locations will be aligned at their maximum point-to-point distance along the travel route 103, and the desired position determined by action of the second mounting feature 171 may thus be repeatable and reliable. In a third aspect, because the article support 131a itself has an extended aspect along the longitudinal dimension of the conveyor belt 129a, a precise maximum point-to-point distance between the first and second longitudinal locations 111a, 113a may be selected which is of sufficient length to reduce and/or eliminate any potential errors in yaw which may be introduced by the gap between the outside diameters of the mounting features of the conveyor belt 129a and the inside dimensions of the interface portions of the article support 131a that permit relative rotation therebetween.

Whereas the yaw condition of the article support 131a relative to the travel route 103 may be observed to be in flux as the article support 131a enters or exits the turn 107 in the travel route 103 (and/or any turn in the travel route 103), to the extent the radius of the turn 107 is kept constant, the article support 131a will at least maintain a constant yaw orientation relative to the travel route 103 while both longitudinal locations 111a, 113a are passing through the turn. As such, the positioning conveyor 127a may be compatible with a load/unload robot (not shown) adapted to remove the substrate carrier 133 while it is passing through turns in a transport path, so long as the load unload robot is capable of controlling yaw offset to a constant value.

Sliding contact between such datum may be encouraged, and generation of particles via such sliding contact may be discouraged, by ensuring that the surfaces are, and/or remain, smooth. Alternatively and/or in addition, a material that exhibits low particle generation may be applied to the datum surfaces so as to encourage smooth sliding with a minimum of particles being generated.

FIG. 6 is a cross-sectional end view of an exemplary embodiment of the conveyor belt 129a of FIG. 5. As shown in FIG. 6, a belt 183 of the conveyor belt 129a may have a high aspect ratio providing a relatively broad extent in the vertical direction, useful for permitting the belt 183 to be subjected to high-precision lateral guidance so as to closely adhere to the travel route 103 (FIG. 4), as well as a relatively narrow extent in the transverse direction, useful for employing the belt 183 to define a precise travel path 141 (FIG. 3) for a conveyed substrate carrier 133 (FIG. 3). For example, in addition to having a high aspect ratio such as is shown in FIG. 6, the belt 183 may also be characterized by unitary, continuous construction in the longitudinal dimension, in which case the narrow extent in the transverse dimension may provide the conveyor belt 129a the capacity to elastically flex in conformance to lateral turns (see turn 107 in FIG. 5) in the travel route 103 (FIG. 5), as well as to permit a potentially infinite number of patterns and point-to-point distances relating to the arrangement of longitudinal locations (e.g., longitudinal locations 111a, 113a of FIG. 5) along the conveyor belt 129a.

FIG. 6 also illustrates that a longitudinal location of the conveyor belt 129a may comprise multiple points on the belt 183. For example, the first mounting feature 165a of the conveyor belt 129a, which may be cylindrical, and, as also shown in FIG. 6, may have an extended vertical aspect suitable to provide a desired degree of precision in pitch and roll, may be fastened to the belt 183 at multiple points 185 on the belt 183, all of which may occupy the same longitudinal position relative to the belt 183 (e.g., they may be aligned along a vertical axis), such that no foreshortening or restoration of a distance between such points occur by virtue of lateral turns in the travel route 103. The first mounting feature 165a may also extend below a lowermost extent 184 of the belt 183, e.g., so as to facilitate coupling of an article support (not shown) entirely below and/or separate from the belt 183.

In some embodiments, mounting features may not extend below a lowermost extent 184 of the belt 183, e.g., so as to insure clearance of any objects that may cause the cradle to be decoupled from the mounting features.

FIG. 7 is a partial cross-sectional top view of a positioning conveyor 127b, which is an embodiment of the positioning conveyor 127 of FIGS. 2-4, and is similar to the positioning conveyor 127a of FIG. 5, having differences therefrom as described below which include at least a breakaway feature for the article support. The positioning conveyor 127b may comprise a conveyor belt 129a similar to that described in FIG. 5, wherein the conveyor belt is also partially schematically illustrated in the form of its travel route 103, and comprises a first mounting feature 165. The positioning conveyor 127b may further include an article support 131b shown in relevant portion, that portion being a first interface portion 187 of the article support 131b. The first interface portion 187 may function and have structure similar to the first interface portion 161 of FIG. 5, but with certain differences. For example, the first interface portion 187 is similar to the first interface portion 161 in that it is adapted during ordinary use to longitudinally and laterally locate the article support 131b on the first longitudinal location 111a of the conveyor belt 129a. One difference is that the first interface portion 187 may comprise a breakaway connection. For example, when urged by a force 189 (e.g., a force created by an impact between the article support 131b passing along the travel route 103 and a slower object, or a relatively motionless object, crossing into and/or appearing within the travel route 103) of a predefined magnitude, e.g., 25 pounds force or more, the first interface portion 187 is adapted to permit the article support 131b to deflect away (e.g., in a direction 190 substantially opposite the longitudinal direction of travel 191 of the conveyor belt 131b) from the first longitudinal location 111a.

In at least one embodiment of the first interface portion 187, because the first interface portion 187 permits the article support 131b to deflect away from the longitudinal location 111a, the article support 131b, as well as any conveyed article associated with the article support, may be permitted to become entirely dislodged from the conveyor belt 129a. For example, the first interface portion 187 may comprise a first finger 193 and a second finger 195 extending from a common support 196 in different circumferential directions around the first mounting feature 165 of the conveyor belt 129a, and the first and second fingers 193, 195 may form at least a portion of a first datum surface 167a similar to the first datum surface 167 of FIG. 5 for locating on and slidably rotatably mating with the second datum surface 169 of the first mounting feature 165. In cross section, the first datum surface 167a may form only a partial circle, wherein at least one portion of a complete circle that is missing may be that portion which would be disposed generally at the downstream or leading portion 197 of the first mounting feature 165 (the missing portion may, for example, be a relatively small portion, e.g., amounting only to a small gap between ends 199 of the first and second fingers 193, 195, or may be somewhat larger, e.g., as shown in FIG. 7). The fingers 193, 195 and the common support 196 may, for example, comprise portions of a single component having a continuous, unitary construction.

In response to the force 189, either the first finger 193, the second finger 195, or both the first and second fingers 193, 195 may be caused to deform, e.g., either elastically (e.g., in the manner of a spring) or plastically (e.g., in the manner of a sacrificial part that becomes bent or broken and must be replaced), so as to cause the first datum surface 167a (and/or the surface that previously comprised the first datum surface 167a prior to the deformation) to demate from the second datum surface 169 of the first mounting feature 165. Further, the first and second fingers 193, 195 and the central support 196 of the first interface portion 187, along with the remainder of the article support 131b, may be caused to deflect away from the first mounting feature 165 of the conveyor belt 129a, e.g., in the direction 190 opposite the longitudinal direction of travel 191 as shown in FIG. 7. As a result, the article support 131b may be caused to detach entirely from the conveyor belt 129a.

In additional and/or alternative embodiments, the first mounting feature 165 may be compressible such that the first and second fingers 193, 195 do not deform or deflect at all in response to the force 189, but the article support 131b may release as a result of compressing the first mounting feature 165. In some embodiments, the article support 131b may release in response to the force 189 as a result of both deformation of the first and second fingers 193, 195 and compression of the first mounting feature 165.

Applicants have observed that building such a breakaway feature into the longitudinally locating first interface portion 187 of the article support 131b may provide advantages over similar equipment lacking a breakaway feature, such as the avoidance of significant damage, and/or the limitation of such damage, to precision transport equipment and delicate in-process workpieces (such as electronic device substrates). For example, the conveyor belt 129a of the positioning conveyor 127b may have been optimized for rotation at relatively high constant speeds in the longitudinal direction 191 of the travel route 103 (e.g., it may be of relatively light weight), and may exhibit one or more dimensional aspects of relatively small size (see, e.g., FIG. 6) (e.g., so as to provide positional and/or orientational precision to conveyed articles, and/or to permit flexure within lateral turns). Moreover, the consequences of damage to the conveyor belt 129a, beyond what may amount to significant costs relating to replacement and/or repair of what may be a delicate and highly-engineered component, could include inconvenient and costly factory downtime in the form otherwise properly functioning processing stations standing idle, or becoming underutilized, due to a failure (or slowdown) in delivery of workpieces.

The inventive breakaway feature described above may effectively isolate the conveyor belt 129a from damage from the force of a frontal impact with an item or person in the travel route 103, and may limit such damage as may occur to the affected conveyed article (not shown) and/or the affected article support 131b, and/or one or more similar components following closely behind the affected components, some and/or all of which may be permitted to fall away from the rotatable article 129a under the force of gravity.

FIG. 8 is a partial cross-sectional top view of a positioning conveyor 127c, which is an embodiment of the positioning conveyor 127 of FIGS. 2-4, and is similar to the positioning conveyor 127b of FIG. 7 in that it includes a breakaway feature for the article support, with differences as explained below. Referring to FIG. 8, the positioning conveyor 127c may comprise a conveyor belt 129a (FIG. 7), wherein the conveyor belt is also partially schematically illustrated in the form of its travel route 103 (FIG. 7), and comprises a first mounting feature 165. The positioning conveyor 127c may further include an article support 131c shown in relevant portion, that portion being a first interface portion 201 of the article support 131c. The first interface portion 201 may function and have structure similar to the first interface portion 187 of FIG. 7, but with certain differences. For example, the first interface portion 201 is similar to the first interface portion 187 in that it may comprise a breakaway connection, wherein when urged by a force 189 (e.g., a force created by an impact between the article support 131c passing along the travel route 103 (FIG. 7) and a slower object, or a relatively motionless object, crossing into and/or appearing within the travel route 103 (FIG. 7)) of a predefined magnitude, e.g., 25 pounds force or more, the first interface portion 201 is adapted to permit the article support 131c to deflect away (e.g., in a direction 190 substantially opposite the longitudinal direction of travel 191 of the conveyor belt 131c) from the first longitudinal location 111a.

Differences between the first interface portion 201 of FIG. 8 and the first interface portion 189 of FIG. 7 at least involve the nature of the fingers and the manner in which they permit the article support 131c to deflect away from the first longitudinal location 111a. For example, the first interface portion 201 may be articulated in that it comprises a first finger 203 and a second finger 205 extending from a common support 207, wherein either or both of the first and second fingers 203, 205, rather than flex or deform in response to the force 189, may instead rotate relative to the common support 207 so as to permit the article support 131c to deflect away from the first longitudinal location 111a. As shown in FIG. 8, such articulation may permit the first and second fingers 203, 205 to rotate away from each other, and by so doing, demate from the first mounting feature 165.

As shown in the embodiment shown in FIG. 8, the central support 207 may comprise a post, and a spring (e.g., a torsional spring such as the spring 209 shown in FIG. 8, or another spring or similar biasing element of suitable construction) may be disposed at the interface between the first finger 203 and the central support 207, and/or at the interface between the second finger 205 and the central support 207, to provide the closure or biasing force necessary for mating (e.g., a spring constant may be selected depending on the preselected magnitude of the desired breakaway force). In other embodiments, the central support 207 may have an extended lateral aspect, each of the first and second fingers 203, 205 may have separate attachments to the central support 207 about which they are adapted to articulate, and separate springs may be provided to provide the necessary biasing force to close each finger relative to the first mounting feature 165.

Figure 9:
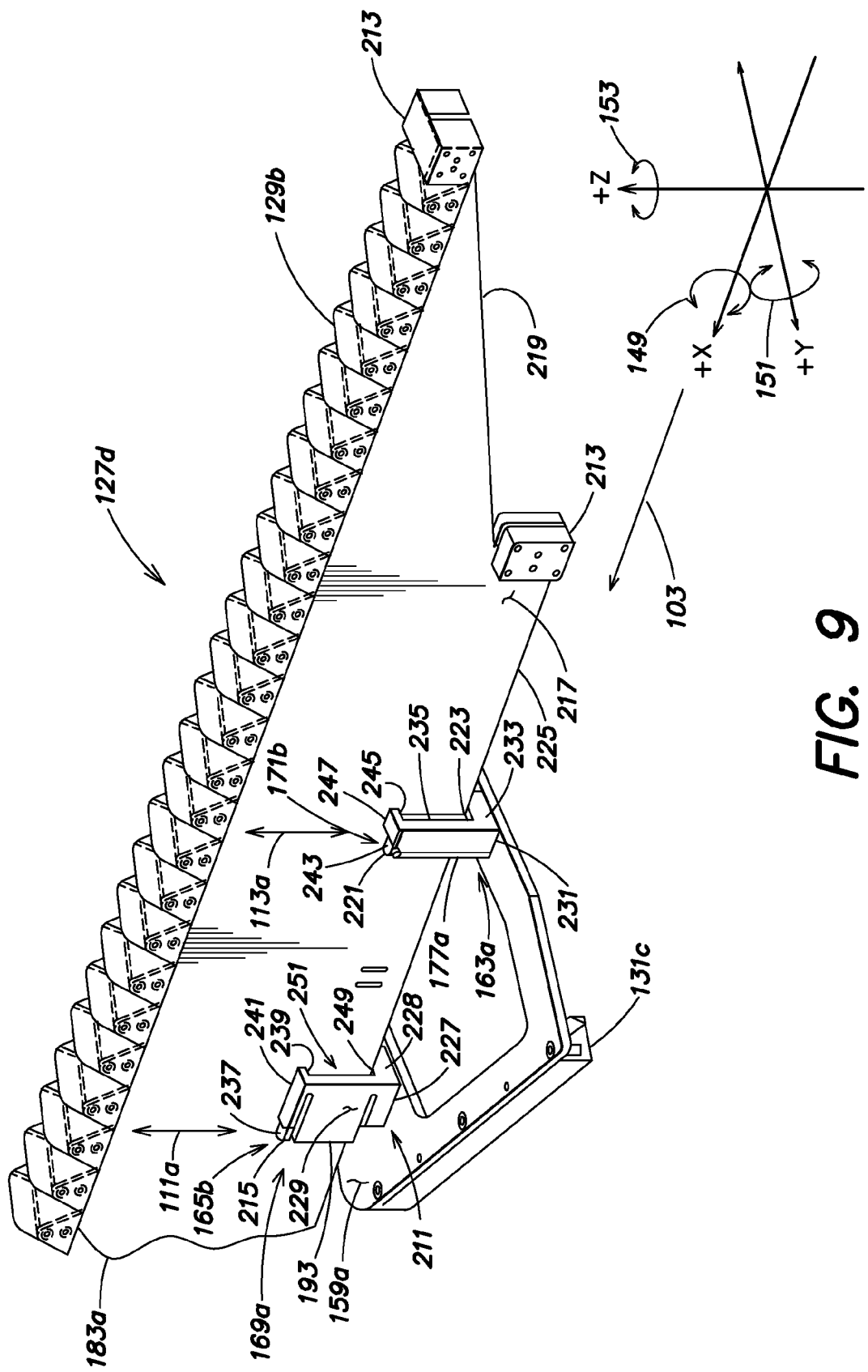
FIG. 9 is a downward, perspective view of an exemplary positioning conveyor according to embodiments of the present invention.

FIG. 9 is a downward, perspective view of an inventive positioning conveyor 127d, which is an embodiment of the positioning conveyor 127 of FIGS. 2-4. The positioning conveyor 127d is also similar to the positioning conveyor 127a of FIG. 5, for example in that the positioning conveyor 127d comprises a conveyor belt 129b that is substantially incompressible, as well as substantially inextensible, in the direction 105 (FIG. 5) of travel of the conveyor belt 129b along the travel route 103 (FIG. 5). And whereas the positioning conveyor 127d of FIG. 9 is different from the positioning conveyor 127a of FIG. 5 in that a first interface portion 211 of the article support 131c of the positioning conveyor 127d comprises a breakaway connection relative to the first mounting feature 165 of the conveyor belt 129b (the breakaway connection functioning, for example, in a similar way to that of the positioning conveyor 127b of FIG. 7), other similarities with the positioning conveyor 127a of FIG. 5 may exist, such as are discussed below with reference to FIG. 9.

The conveyor belt 129b may comprise a belt 183a, which may be similar to the belt 183 of FIG. 6. For example, the belt 183a may be long enough to extend in a loop throughout the entire travel route 103 (FIG. 5), such that opposite ends of the belt 183a may be attached to each other, e.g., via a common attachment to one or more brackets 213 adapted for the purpose. The conveyor belt 129b may further include first and second mounting features 165b, 171b attached to the belt 183*a*, and the first and second mounting features 165*b*, 171*b* of the conveyor belt 129*b* may each comprise at least two pieces.

A first piece 215 and a second piece (not visible) of the first mounting feature 165*b* may be respectively attached to opposite first and second lateral sides 217, 219 of the belt 183*a* so as to form separate but cooperatively functioning segments of a datum surface, e.g., a second datum surface 169*a*. The second datum surface 169*a*, which may be a cylindrically shaped embodiment of the second datum surface 169 (see FIG. 5 and the above description related thereto), may extend upward along the belt 183*a* so as to exhibit an extended vertical aspect. Such an extended vertical aspect for the second datum surface 169*a* may, for example, be advantageous for distributing inertial loads in the form of roll moments 149 (see also FIG. 2 and the description relating thereto) along a vertical axis. As shown in FIG. 9, such a vertical axis may comprise the first longitudinal location 111*a* (see also FIG. 5 and the above description related thereto) of the conveyor belt 129*b*.

A first piece 221 and a second piece (not visible) of the second mounting feature 171*b* may be respectively attached to the first and second lateral sides 217, 219 of the belt 183*a* so as to form separate but cooperatively functioning segments of a datum surface, e.g., a fifth datum surface 177*a*. The fifth datum surface 177*a*, which may be a cylindrically shaped embodiment of the fifth datum surface 177 shown in and described with reference to FIGS. 5 and 7, may extend upward along the belt 183*a* so as to exhibit an extended vertical aspect. Such an extended vertical aspect for the fifth datum surface 177*a* may, for example, be advantageous for distributing inertial loads in the form of roll moments 149 (see also FIG. 2 and the description relating thereto) along a vertical axis. As shown in FIG. 9, such a vertical axis may comprise the second longitudinal location 113*a* (see also FIG. 5 and the above description related thereto) of the conveyor belt 129*b*.

Lowermost extents (e.g., a lowermost extent 223 of the first piece 221 of the second mounting feature 171*b*) of the first and second pieces of the first and second mounting features 165*b*, 171*b* may be disposed at the same elevation as a lowermost extent 225 of the belt 183. Alternatively, the lower extents of the first and second pieces of the mounting features may be disposed at a relatively higher elevation (e.g., a slightly higher elevation), or at a relatively lower elevation (e.g., as shown in FIG. 6).

The first interface portion 211 of the article support 131*c* may include a central support 227 attached (e.g., fixedly attached) to a support 159*a* of the article support 131*c* (from which a conveyed substrate carrier (not shown) may depend), and which may have a transversely extending portion 228 that passes laterally beneath the lowermost extent 225 of the belt 183*a*, so as to provide support on both sides of the belt 183*a*. The central support 227 of the first interface portion 211 may also have a first vertically extending portion 229 extending upward along the first lateral side 217 of the belt 183*a*, and a second vertically extending portion (obscured) extending upward along the second lateral side 219 thereof.

The first interface portion 211 may also include a first finger 193, similar to the first finger 193 of the first interface portion 187 of FIG. 7, which may extend longitudinally from the first vertically extending portion 229 and peripherally around the first mounting feature 165*b* of the conveyor belt 129*b*. The first finger 193 may be of unitary, continuous construction with the first vertically extending portion 229, and may thereby provide the spring force necessary to permit a first datum surface (obscured) of the finger to remain mated with the second datum surface 169*a* of the first mounting feature 165*b* during normal operation, and to allow the first finger 193 to flex outward, and thus demate from the first mounting feature 165*b* (see also FIG. 7 and related description), for example, when urged to so flex by a frontal force 189 (FIG. 7) of a magnitude (e.g., 25 pounds force) predetermined to trigger such a breakaway. The first interface portion 211 may also include a second finger (obscured) (e.g., of which the first datum surface may also form a part) and a second vertically extending portion (obscured) adapted to function in the same or a similar manner on the second lateral side 221 of the belt 183*a*.

The article support 131*c* may also include a second interface portion 163*a* which may be an embodiment of the second interface portion 163 of the article support 131*a* of FIG. 5. For example, the second interface portion may include a central support 231 attached (e.g., fixedly attached) to the support 159*a* of the article support 131*c*, and which may have a transversely extending portion 233 that passes laterally beneath the lowermost extent 225 of the belt 183*a*, so as to provide support on both sides of the belt 183*a*. The central support 231 of the second interface portion 163*a* may also have a first vertically extending portion 235 extending upward along the first lateral side 217 of the belt 183*a*, and a second vertically extending portion (obscured) extending upward along the second lateral side 221 thereof. The first vertically extending portion 235 and the second vertically extending portion (obscured) may respectively comprise third and fourth datum surfaces (obscured) adapted to locate on the fifth datum surface 177*a* of the second mounting feature 171*b* of the conveyor belt 129*b*. For example, the third and fourth datum surfaces (obscured) may comprise substantially planar surfaces adapted to smoothly interface with a substantially cylindrically shaped fifth datum surface 177*a* of the second mounting feature 171*b* as illustrated in FIG. 9.

As mentioned above with respect to FIG. 5, interaction between the first datum surface 167 (of the first interface portion 161 of the article support 131*a*) and the second datum surface 169 (of the first mounting feature 165 of the conveyor belt 129*a*), and/or interaction between the third and fourth datum surfaces 173, 175 (of the second interface portion 163 of the article support 131*a*) and the fifth datum surface 177 (of the conveyor belt 129*a*), may include weight force transmission (e.g., so that the force of weight is passed from the article support 131*a* to the conveyor belt 129*a*). As shown in FIG. 9, and as alluded to earlier, such weight force transmission may be accomplished in a different manner.

As shown in FIG. 9, where cylindrical shapes for the first datum surface (obscured) and the second datum surface 169*a* are oriented substantially vertically, such surfaces may be essentially isolated from the function of weight force transmission. For example, the first mounting feature 165*b* may comprise a first weight bearing surface 237 on the first lateral side 217 of the conveyor belt 129*b*. The first weight bearing surface 237 may face upward (e.g., may be planar (and horizontally oriented or inclined, or curved or conical) so as to permit a complementary surface 239 of one or more transversely extending tabs 241 of the first interface portion of the article support 131*c* to rest on the first weight bearing surface 237, and to permit conveyor belt 129*b* to bear a weight of the conveyed article (not shown) and/or a weight of the conveyed article/article support subassembly at the first longitudinal location 111*a*. Optionally, the second mounting feature 171*b* may comprise a second weight bearing surface 243 on the first lateral side 217 of the conveyor belt 129*b*. The second weight bearing surface 243 may face upwards (e.g., may be planar (e.g., horizontally oriented or inclined), or curved or conical)

so as to permit a complementary surface 245 of one or more transversely extending tabs 247 of the second interface portion 163a of the article support 131c to rest on the second weight bearing surface 237, and to permit the conveyor belt 129b to bear a weight of the conveyed article (not shown) and/or a weight of the conveyed article/article support subassembly at the second longitudinal location 113a. For example, the first and second mounting features 165b, 171b may share the burden of a total weight of the same in a longitudinally distributed fashion, and sliding-rotational contact (e.g., at the first longitudinal location 111a ), and/or sliding rotational and translational contact (e.g., at the second longitudinal location 113a) may be permitted between the weight bearing surfaces and the complementary surfaces of the tabs as necessary (e.g., because relative rotation and/or translation between the longitudinal locations 111a, 113a must be allowed). Similar weight bearing surfaces and transversely extending tabs may be provided on the second lateral side 219 of the conveyor belt 129b, e.g., so as to provide laterally balanced support.

As described above, dislodgement of the article support 131c of FIG. 9 from the conveyor belt 129b may be provided at least in part by the breakaway connection formed between the finger/s 193, 195 and the first mounting feature 165b. Control may be exerted over such a dislodgment, e.g., as described below.

The first interface portion 211 of the article support 131c may further include a guide surface 249 (e.g., a planar surface, a curved surface, etc.) disposed below the first mounting feature 165b of the conveyor belt 129b, and the first mounting feature 165b may include a complementary surface (obscured) that permits longitudinally sliding contact with the guide surface 249 of the first interface portion 211. In the event the article support 131c, (e.g., in the process of a longitudinally oriented dislodgement from the conveyor belt 129b) is urged upward toward the conveyor belt 129a, the guide surface 249 of the first interface portion 211 may achieve contact with the complementary surface (obscured) of the first mounting feature 165b (e.g., preventing the article support 131c from moving further upwardly). A slot 251 (e.g., a longitudinally oriented slot) may thus be formed at the first longitudinal location 111a on the first lateral side 217 of the conveyor belt 129b between opposing surfaces 239, 249 of the first interface portion 211 of the article support 131c, and the slot 251 may be employed to channel movement of the article support 131c relative to the conveyor belt 129b along the longitudinal direction (e.g., at least until the fingers 193 have demated from the first mounting feature 165b, and the article support 131c may be allowed to fall away from the conveyor belt 129b). Similar paired surfaces and/or movement control slots may be provided as necessary/as desired on the second lateral side of the conveyor belt 129b at the first longitudinal location 111a, and/or on either or both lateral sides 217, 219 of the conveyor belt 129b at the second longitudinal location 113a.

Figure 10A:
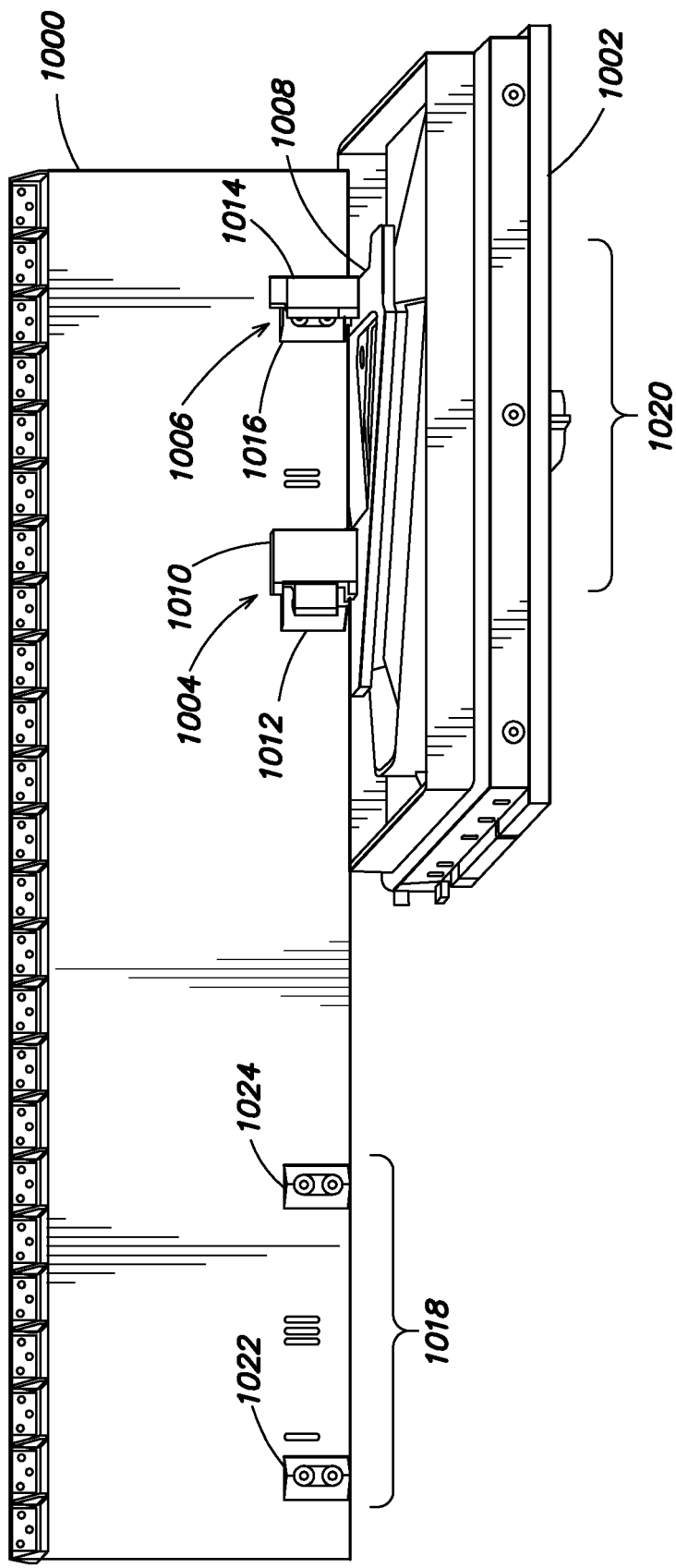
FIGS. 10A and 10B are perspective views of an example of a portion of a conveyor belt according to embodiments of the present invention.
Figure 10B:
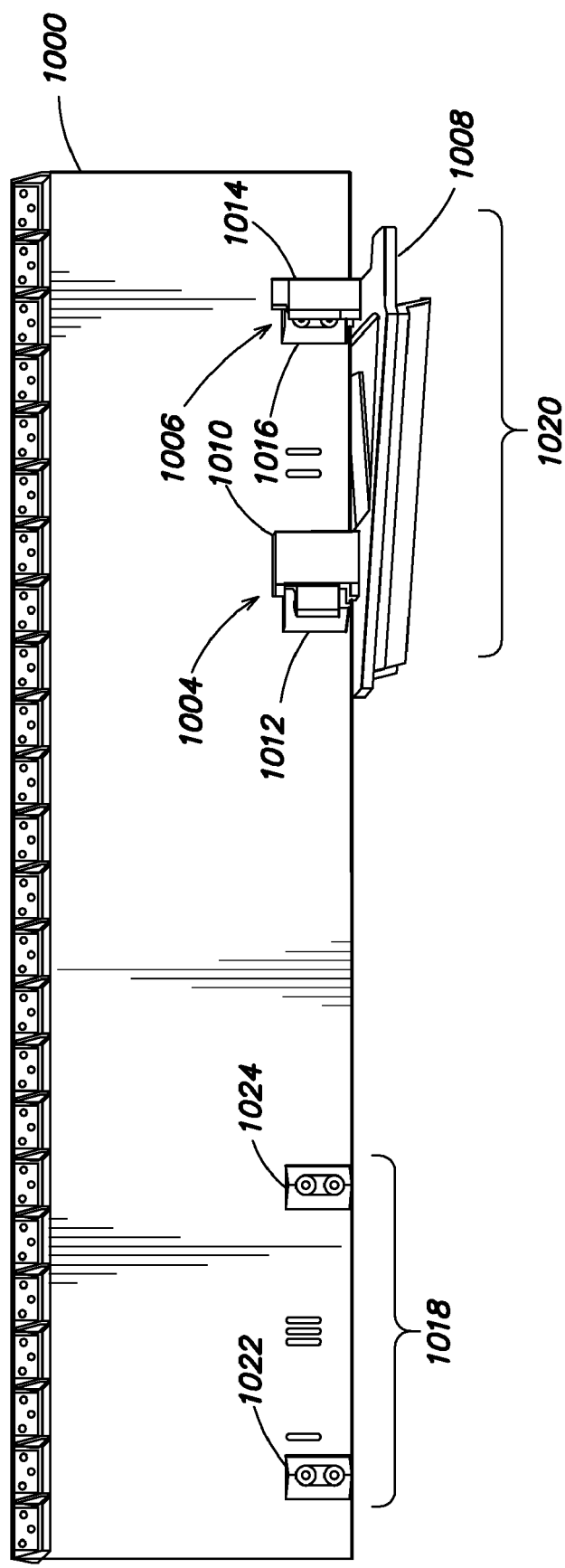

Turning to FIGS. 10A and 10B, a specific embodiment of the present invention is now described in detail. FIG. 10 depicts an example of a portion of a conveyor belt 1000. The particular example portion depicted is long enough to transport two small lot substrate carriers 1002 approximately 500 mm apart from each other.

In some embodiments, the methods and apparatus of the present invention may simultaneously use two different couplings 1004,1006 to mount a cradle 1008 onto the conveyor belt 1000. The first coupling 1004 may accommodate rotational forces applied to the cradle 1008 by the conveyor belt 1000 as the conveyor belt 1000 bends through turns on a transport path (not pictured). In some embodiments, the first coupling 1004 may include a support bearing 1010 rigidly attached to the cradle 1008 and adapted to be rotatably carried by a key 1012 rigidly attached to the conveyor belt 1000.

The second coupling 1006 may accommodate longitudinal forces applied to the cradle 1008 by the conveyor belt 1000 as it bends and the length of conveyor belt 1000 between the two couplings 1004,1006 increases. The second coupling 1006 may include a support bearing, such as the longitudinal slide bearing 1014 depicted in FIGS. 10A and 10B, rigidly attached to the cradle 1008 and adapted to provide a channel within which a second key 1016 rigidly attached to the conveyor belt 1000 is free to move longitudinally while carrying the cradle 1008. In some embodiments, one or more additional couplings may be used for a given support. In alternative and/or additional embodiments, the fist coupling 1004 may be used as a lead coupling as the cradle 1008 moves along the transport path. In other embodiments, the second coupling 1006 may be used as the lead coupling as the cradle 1008 moves along the transport path.

In alternate and/or additional embodiments, the couplings 1004,1006 may be break-away couplings. In such embodiments, if the cradle 1008 (or a substrate carrier 1002 held by the cradle 1008) unexpectedly encounters an obstruction, the couplings 1004,1006 may controllably (e.g., in a predictable direction) release the cradle 1008 such that the amount of force applied to the conveyor belt 1000 as a result of the collision is limited to a predetermined amount of break-away force that will not damage the conveyor belt 1000 or drive system. In some embodiments, the predefined amount of force may be approximately 25 pounds of force. Other break-away forces may be used.

In one or more embodiments, the bearing 1010 of the first coupling 1004 may be a spring and/or clip bearing that rotatably attaches to the key 1012 but releases the key 1012 (through deformation of the springs and/or compression of the key 1012) if more than the predetermined amount of break-away force is applied in the longitudinal direction. Since the second coupling 1006 does not restrict the movement of the cradle 1008 in the longitudinal direction, the second coupling 1006 may allow controlled release the cradle 1008 by having the slide bearing 1014 limited in length to the minimum length required to accommodate the sharpest (e.g., smallest radius) bends that the conveyor belt 1000 will normally be required to accommodate. Thus, mounts that use break-away couplings 1004,1006 according to the present invention may prevent the conveyor belt 1000 from stopping or being damaged in the case of a collision between cradles 1008 (or substrate carriers 1002 suspended from the cradles 1008) mounted on the conveyor belt 1000 and other objects.

Note that in the example of FIG. 10A, there are two locations 1018,1020 for mounting a cradle 1008. The location 1018 on the left side of FIG. 10A does not have a cradle 1008 mounted while the location 1020 on the right side of FIG. 10A includes a mounted cradle 1008 supporting an example of a small lot substrate carrier 1002. The difference between the left side and right side of FIG. 10A represents the difference between a mounted cradle 1008 with a supported carrier 1002 (on the right side) and an empty mounting location 1018 (on the left side) in which, e.g., a cradle (not pictured) may have been dislodged using the break-away feature of the present invention. Note the example of a mounting location 1018 includes two keys 1022,1024 spaced appropriately to engage bearing fixtures 1010,1014 on a cradle 1008.

In contrast to FIG. 10A, FIG. 10B depicts the same example portion of a conveyor belt 1000, however, the cradle 1008 in the right location 1020 is not supporting a substrate carrier 1002 as is the cradle in the right location 1020 of FIG. 10A. This difference represents the difference between a loaded cradle and an unloaded cradle.

As with the example of FIG. 10A, the example in FIG. 10B depicts two locations 1018,1020 for mounting a cradle. The location 1018 on the left side of FIG. 10B does not have a cradle mounted while the location 1020 on the right side of FIG. 10B includes a mounted cradle 1008. As with FIG. 10A, the difference between the left side and right side of FIG. 10B represents the difference between a mounted cradle 1008 (on the right side) and a mounting location 1018 (on the left side) in which a cradle (not pictured) may have been dislodged using the break-away feature of the present invention.

Thus, in normal operation, the cradle 1008 provides a means to support substrate carriers 1002 that are loaded and unloaded at processing tools (not pictured). In contrast, the couplings 1004,1006 or mounts hold the cradles 1008 on the conveyor belt 1000 unless a collision causes a cradle 1008 to become dislodged or the conveyor system was initially configured without a cradle 1008 at each mounting location 1018. Thus, in some configurations, not all mounting locations 1018 will have a cradle 1008 mounted.

The mounting locations (e.g., 1018,1020) in the example embodiment of FIGS. 10A & 10B each include a pair of keys 1012,1016 and 1022,1024 or vertical dowels that are each bisected by the conveyor belt 1000. The keys 1012,1016 may be rigidly attached to the conveyor belt 1000 at a predefined distance apart from each other and at a predefined distance from other key pairs 1022,1024. In the specific example depicted, the keys 1012,1016,1022,1024 are attached to the conveyor belt 1000 using two through bolts but could alternatively and/or additionally be mounted using different fasteners, adhesives, and/or other methods such as, e.g., welding. In additional and/or alternative embodiments, keys may be different from each other to accommodate and/or engage different types of bearings.

Figure 11:
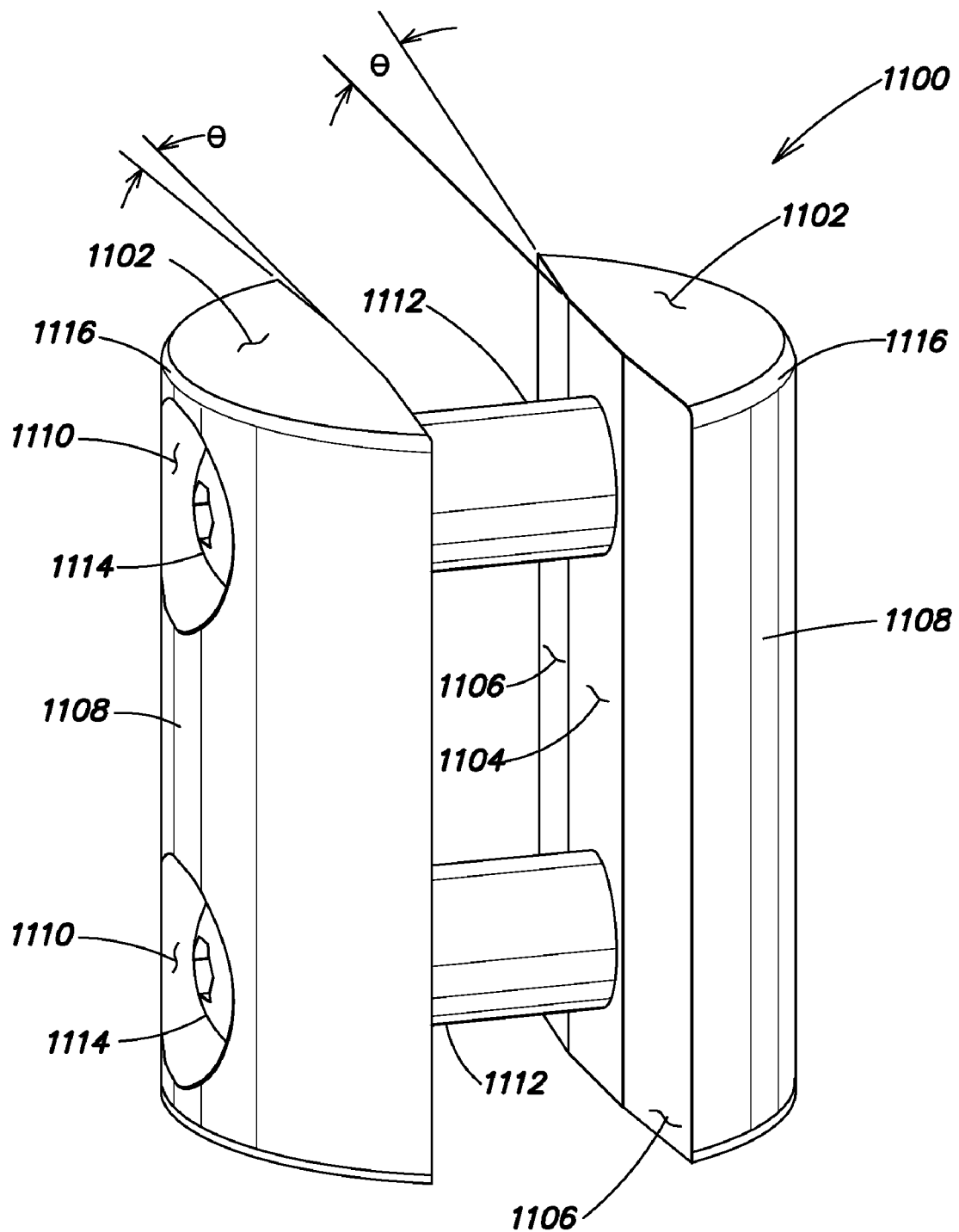
FIG. 11 is a perspective view of an example embodiment of a key according to embodiments of the present invention.

Turning to FIG. 11, a perspective drawing depicting an example embodiment of a key 1100 (or vertical dowel) is provided. A key 1100 may include load bearing surfaces 1102, attachment surfaces 1104, relief surfaces 1106, and position bearing surfaces 1108. In some embodiments, a key suitable for use with the present invention may be made of ultra-high molecular weight (UHMW) plastic, stainless steel, or aluminum and be approximately 1.25 inches high and 1.2 inches in diameter. However, other materials and dimensions that are practicable may be used. Note that, keys made from UHMW may be compressible and allow the use of rigid or semi-rigid clip arms on the rotatable bearings.

A load bearing surface 1102 in the example of FIG. 11 is the flat, horizontal, top surface of the key 1100 which is where the bearings 1010,1014 attached to the cradle 1008 are supported. To reliably support the weight of a cradle 1008 and a substrate carrier 1002, an appropriate amount of area of a load bearing surface 1102 for a key 1100 such as depicted in FIG. 11 would be 0.125 square inches. However, other dimensions that are practicable may be used. An attachment surface 1104 in the example of FIG. 11 is the flat vertical surface that contacts the conveyor belt (not shown). A relief surface 1106 in the example of FIG. 11 is the flat vertical surface adjacent the attachment surface 1104 that does not contact the conveyor belt 1000. A position bearing surface 1108 in the example of FIG. 11 is the curved vertical surfaced shaped to engage a collar or spring arms of a rotatable bearing or to slide in a channel of a longitudinal bearing. In addition, a key 1100, as indicated above, may include one or more through holes 1110 and spacers 1112 for attaching the key 1100 to a conveyor belt 1000 using fasteners 1114. A key 1100 may also include one or more beveled surfaces 1116 included to eliminate sharp edges that may chip or otherwise snag on the surfaces of the bearings 1010,1014.

In the example embodiment of FIG. 11, a key 1100 is depicted that has a minimized attachment surface 1104, both horizontally (i.e., longitudinally along the length of the conveyor belt) and vertically (i.e., along the height of the conveyor belt). By minimizing the horizontal dimension of the attachment surface 1104, the conveyor belt 1000 can make tighter turns (i.e., have a smaller bend radius) along the transport path. Thus, for a given bend radius there is a maximum horizontal dimension of the attachment surface 1104 that will not induce appreciable stress on the conveyor belt 1000. For example, for a conveyor belt 1000 made of polyurethane or spring stainless steel (e.g., austenitic 17-7) with a bend radius of twenty-four inches, the maximum horizontal dimension of the attachment surface 1104 would be approximately 0.25 inches. However, other materials and dimensions that are practicable may be used. Further, depending on the materials used, the horizontal dimension of the attachment surface 1104 may need to be large enough to provide sufficient surface area to accommodate whatever fastening method is employed to rigidly attach the key 1100 to the conveyor belt 1000. For example, the horizontal dimension of the attachment surface 1104 may need to be large enough to allow the use of a particular gage fastener which is needed to support a portion of the weight of a cradle and loaded substrate carrier.

As with the horizontal dimension of the attachment surface 1104, the vertical dimension may need to be large enough to provide sufficient surface area to accommodate whatever fastening method is employed to rigidly attach the key 1100 to the conveyor belt 1000. Further, while the vertical dimension of the attachment surface 1104 may not need to be reduced to accommodate the minimum bend radius, it may need to be increased to meet a minimum amount of lateral support requirement. For example, the preferred amount of lateral swing of a substrate carrier on a positioning conveyor is zero. Thus, the vertical dimension of the attachment surface 1104 is preferably large enough to prevent any lateral motion of the cradle relative to the conveyor belt. For example, for a conveyor belt made of polyurethane, the minimum vertical dimension of the attachment surface 1104 would be approximately 1.25 inches. However, other materials and dimensions that are practicable may be used.

A relief surface 1106 may be a flat or curved surface that angles or slopes away from the attachment surface 1104 at an angle θ so as to avoid any contact with the conveyor belt 1000 even in the tightest of bends (smallest bend radius) in the transport path. For example, in some embodiments wherein the smallest bend radius is approximately twenty-four inches, the angle θ would be approximately seven degrees. Both halves of the key 1100 may include two relief surfaces 1106 (e.g., a leading and a trailing relief surface 1106). Other bend radius values and/or angles θ may be used.

A position bearing surface 1108 may be shaped to mate with a support bearing 1010,1014 attached to a cradle 1008. The position bearing surface 1108 may be shaped to mate with both a rotatable support bearing 1010 and/or a longitudinal slide support bearing 1014. In some embodiments, keys 1100 may have different position bearing surfaces 1108 depending on the type of support bearing with which they are to mate.

Figure 12:
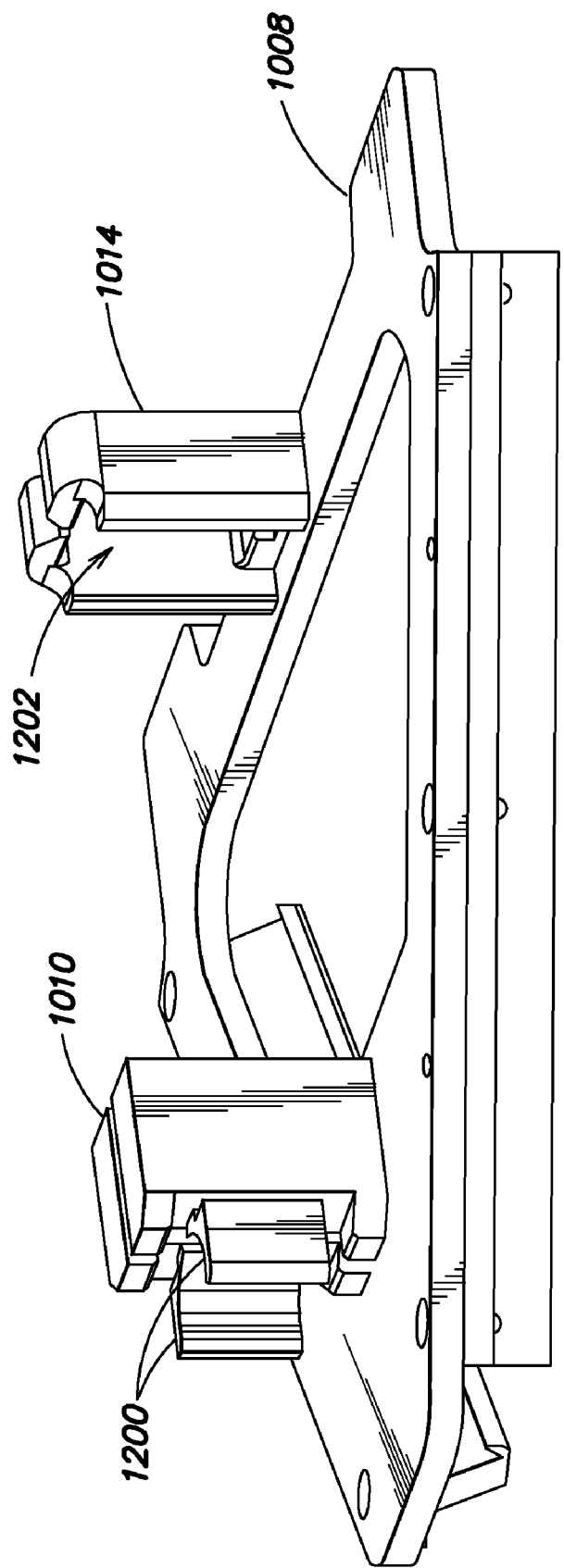
FIG. 12 is a perspective view of an example embodiment of a cradle including a rotatable support bearing and a longitudinal slide support bearing according to embodiments of the present invention.
Figure 13A:
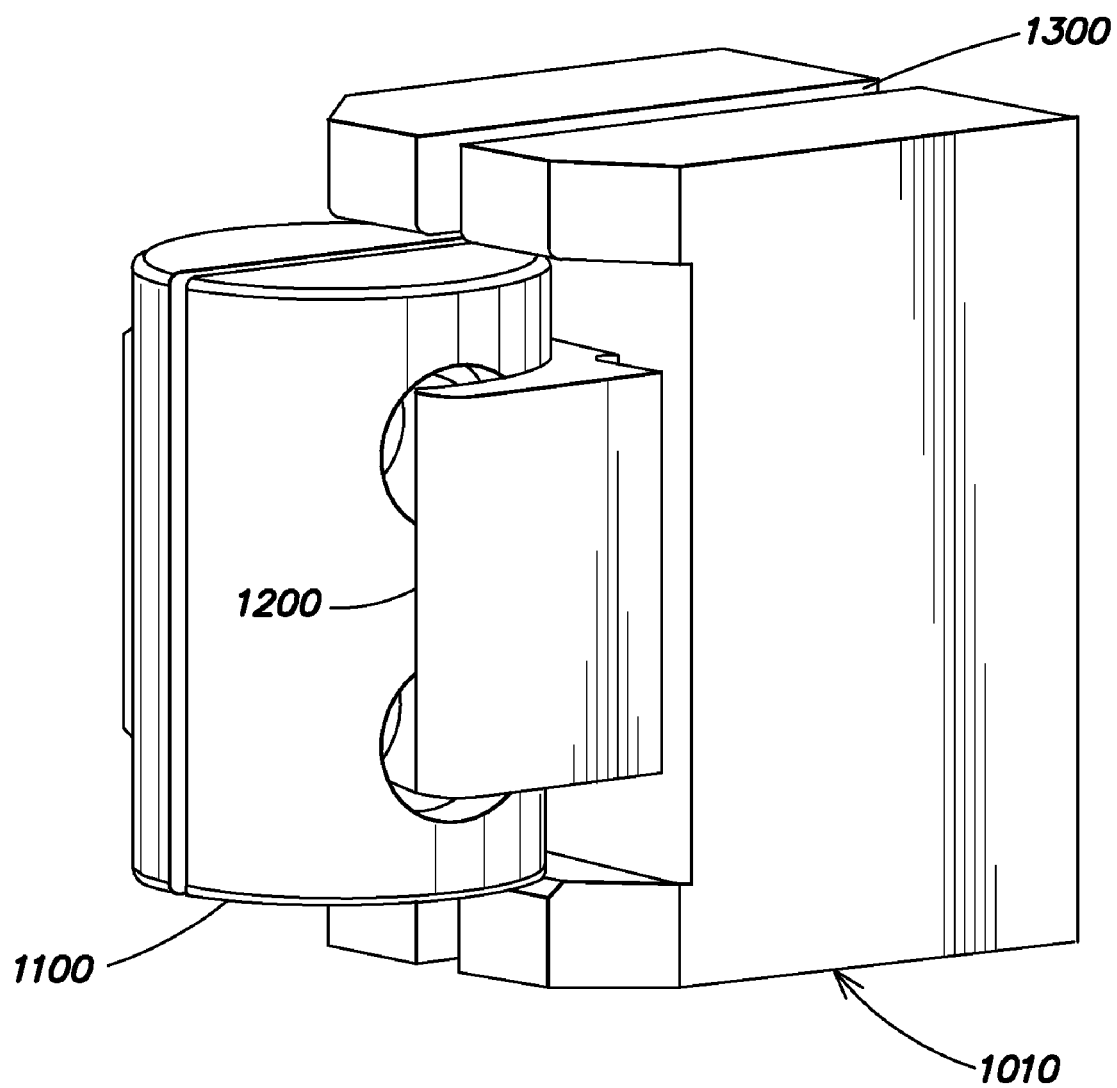
FIGS. 13A through 13D include perspective, side, front, and top views (respectively) of the example rotatable support bearing of FIG. 12 depicted with the example key of FIG. 11 according to embodiments of the present invention.
Figure 13B:
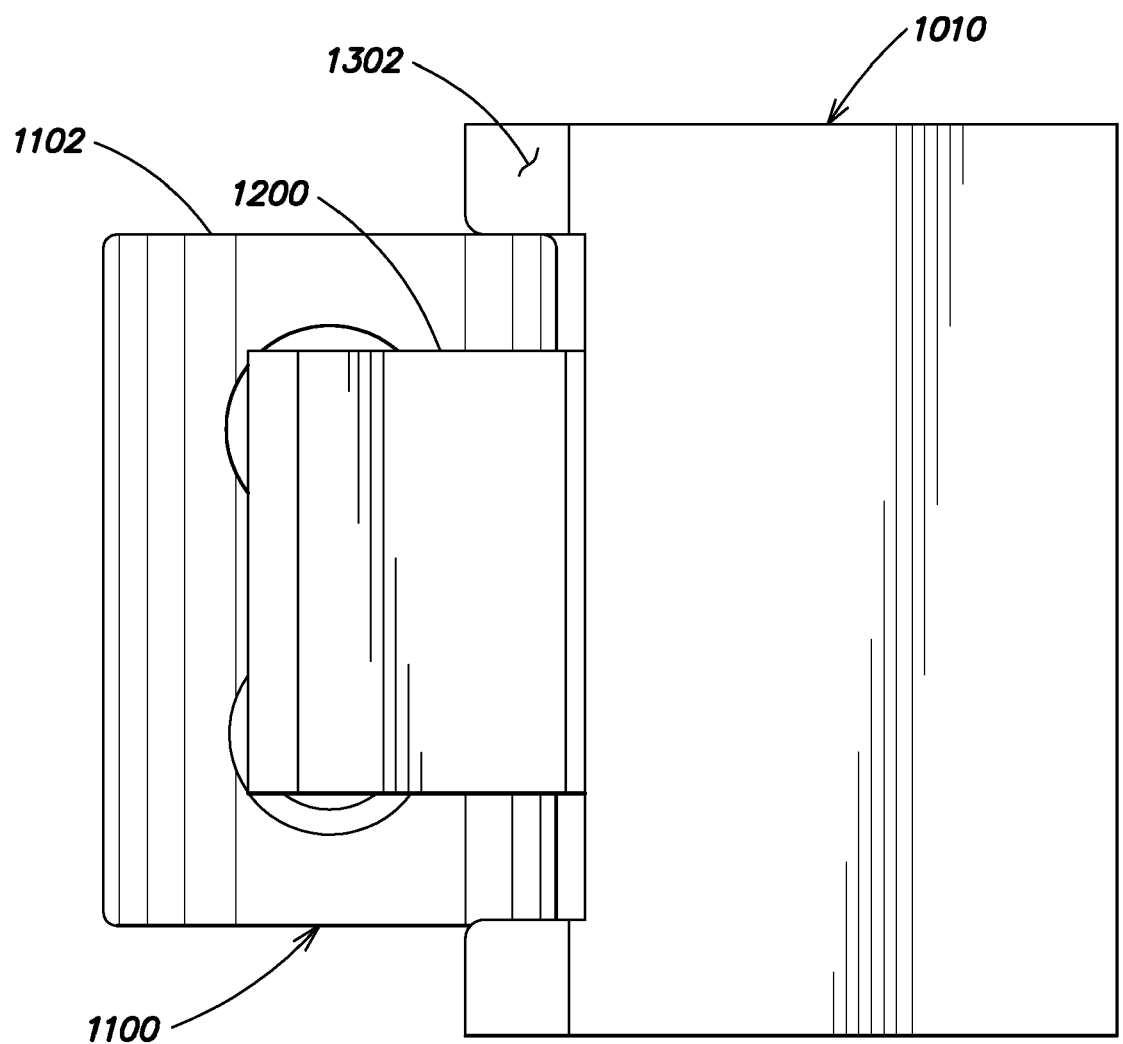
Figure 13C:
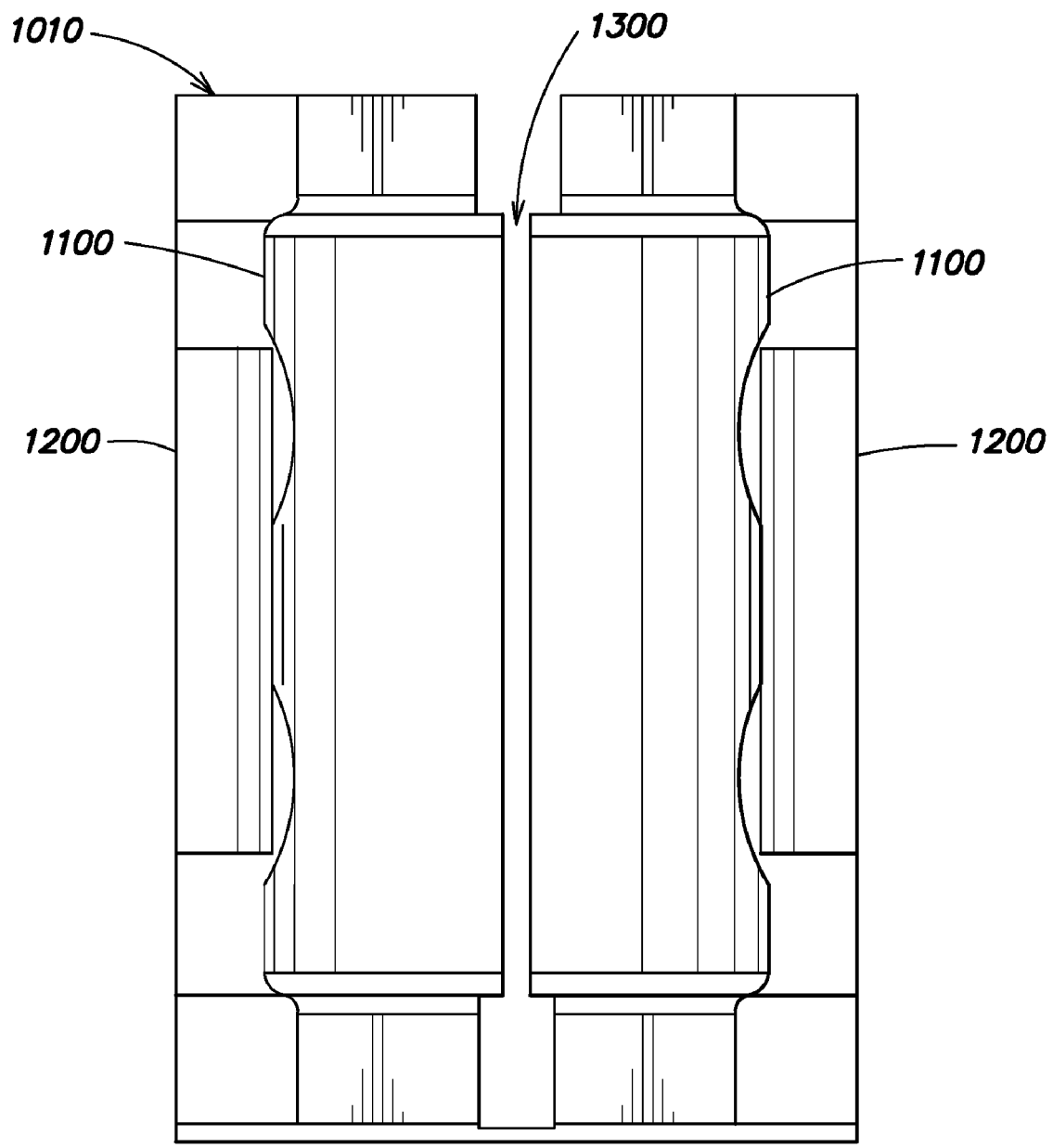
Figure 13D:
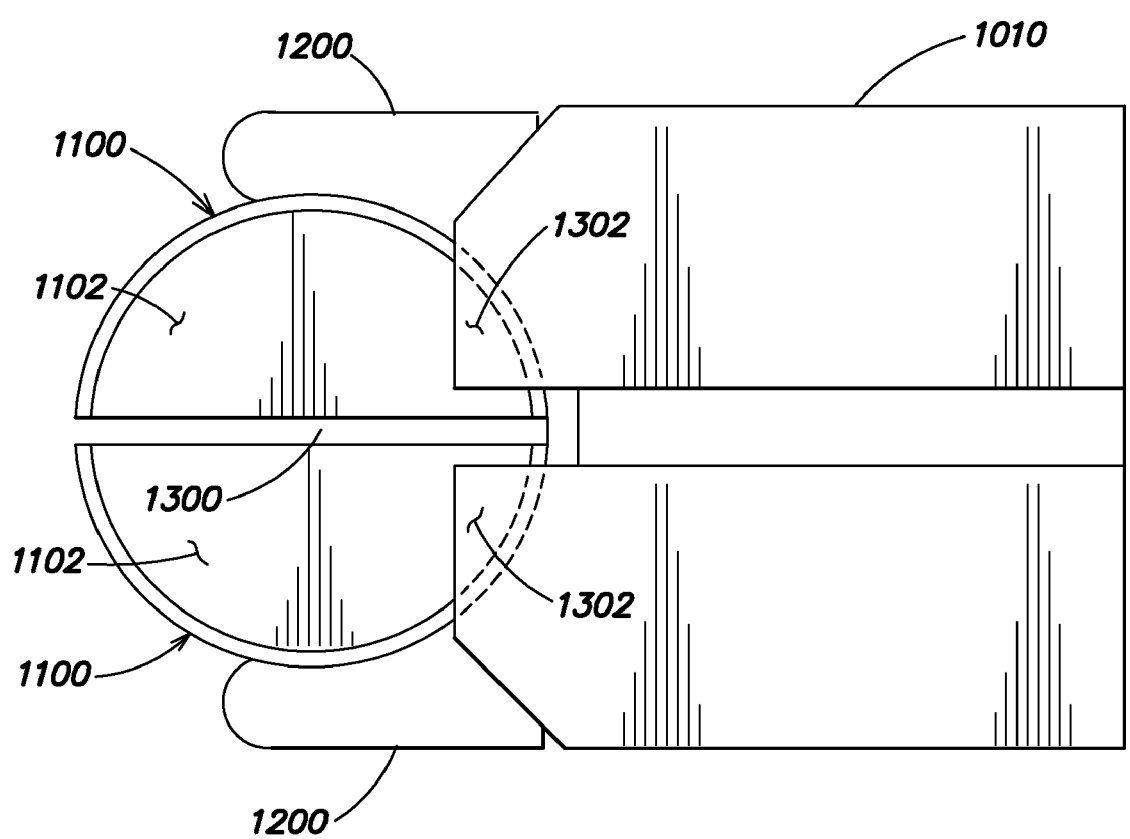
Figure 13E:
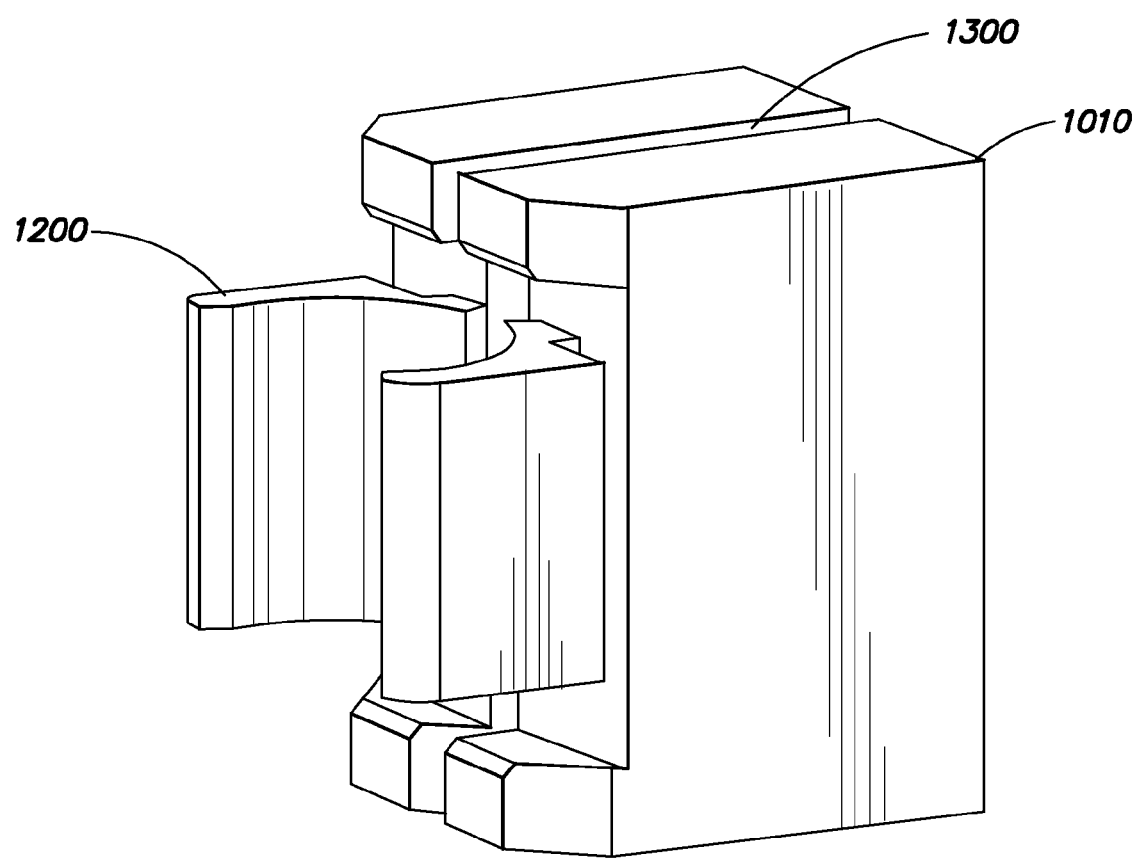
FIGS. 13E through 13H include perspective, side, front, and top views (respectively) of the example rotatable support bearing of FIG. 12 depicted without a key according to embodiments of the present invention.
Figure 13F:
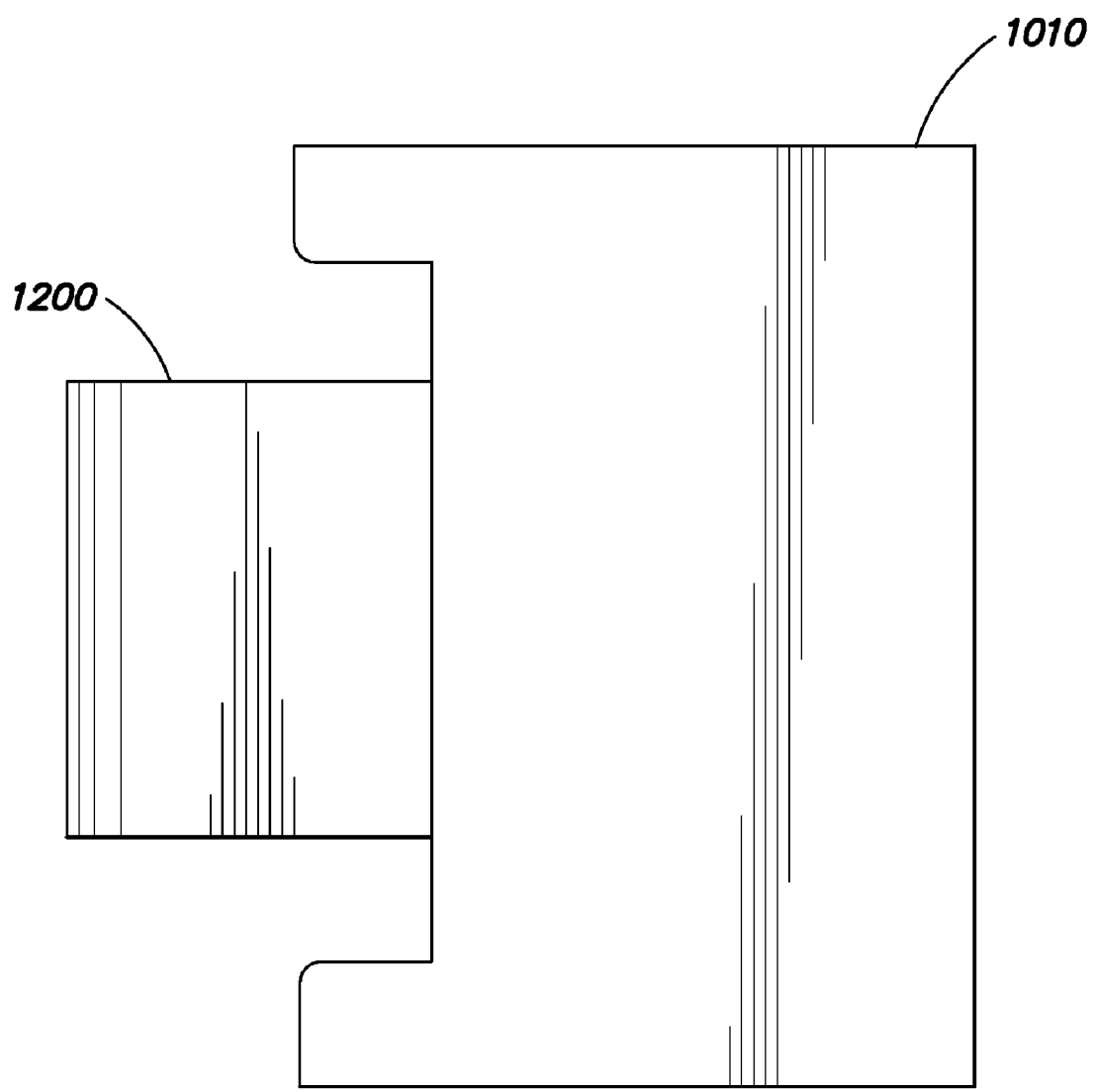
Figure 13G:
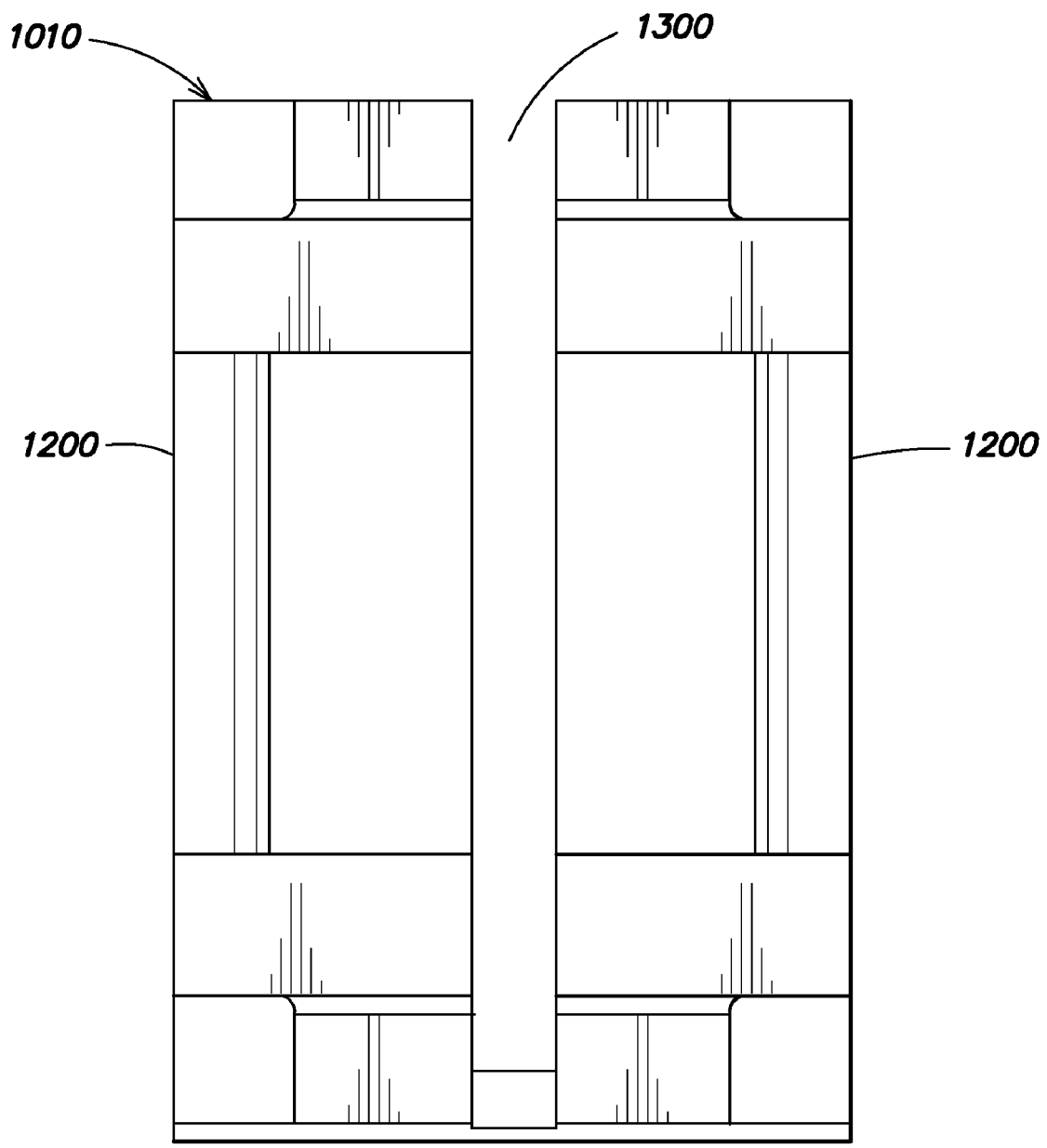
Figure 13H:
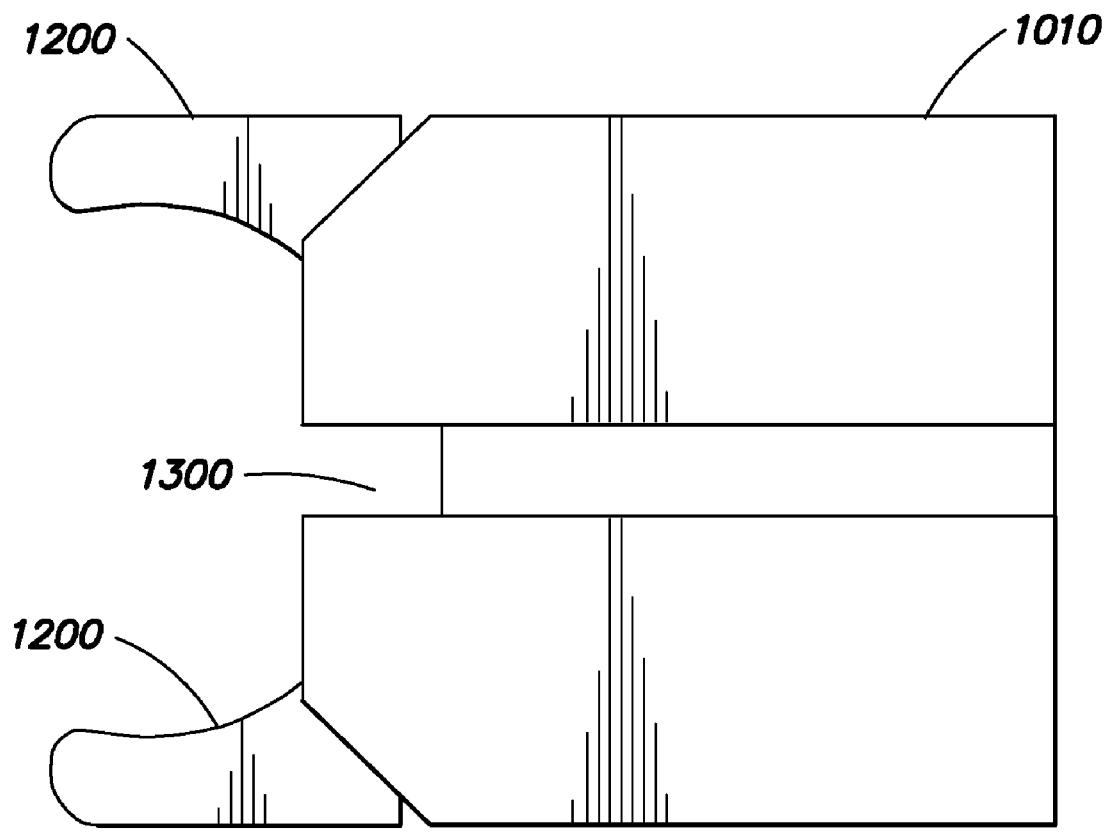

Turning to FIG. 12, a cradle 1008 with an example embodiment of a leading rotatable support bearing 1010 and a trailing longitudinal slide support bearing 1014 is shown. Note that the example leading rotatable support bearing 1010 includes two spring arms 1200 for coupling to a key 1100 and the trailing longitudinal slide support bearing 1014 includes a channel 1202 or slot for receiving a key 1100.

Turning to FIGS. 13A through 13D, perspective, side, front, and top views (respectively) of the example rotatable support bearing 1010 of FIG. 12 are depicted with the example key of FIG. 11 inserted in the spring arms 1200 of the bearing 1010. In some embodiments, a rotatable support bearing 1010 suitable for use with the present invention may be made of ultra-high molecular weight (UHMW) plastic, spring stainless steel, and/or aluminum and be approximately 1.5 inches high and 1.5 inches wide. However, other materials and dimensions that are practicable may be used. Note that a simplified representation of the example key 1100 is used in these figures and the relief surfaces 1106 are not discernable.

FIGS. 13E through 13H also provide perspective, side, front, and top views (respectively) of the example rotatable support bearing 1010 of FIG. 12 but without the example key 1100 inserted. Note that to more clearly illustrate the bearing 1010 and how the key 1100 fits into the rotatable support bearing 1010, the conveyor belt 1000 is not depicted in these figures but would normally fit in the slot 1300 bisecting both the key 1100 and bearing 1010. Also note, as shown in the drawings but most clearly in FIGS. 13B and 13D, that at least a portion 1302 of the rotatable support bearing 1010 overhangs the top of the key 1100 and rests on the load bearing surface 1102 of the key 1100. To reduce particle generation from surfaces in contact, the amount of overhang 1302 in contact with the load bearing surface 1102 may be minimized to provide just enough support sufficient to carry half the weight of a cradle 1008 and a loaded substrate carrier 1002 (in a two bearing embodiment). Also as shown in the drawings but most clearly in FIG. 13D, the spring arms 1200 extend more than 180 degrees around the key 1100 so as to rotatably but securely couple the bearing 1010 to the key 1100.

Figure 14A:
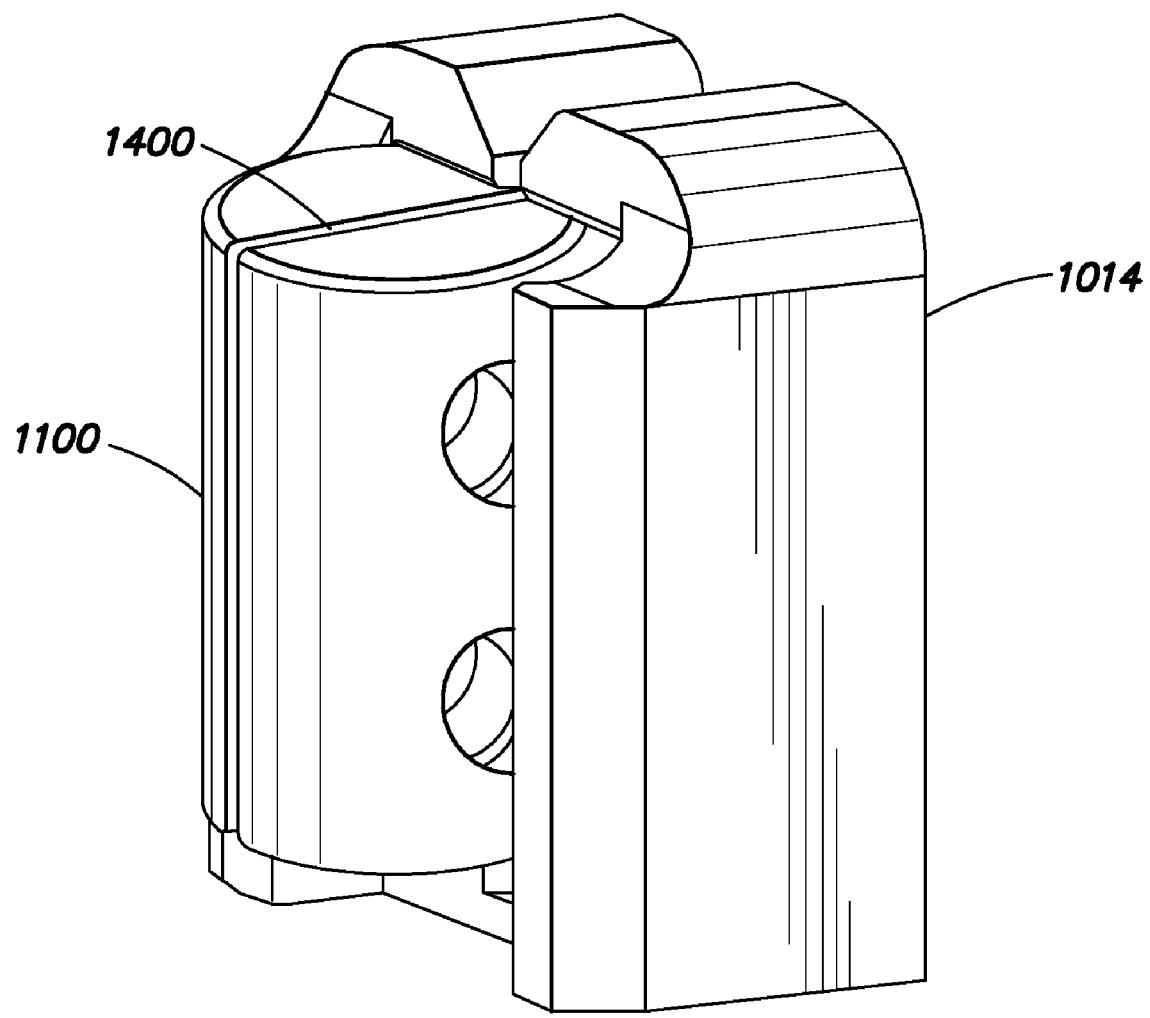
Figure 14B:
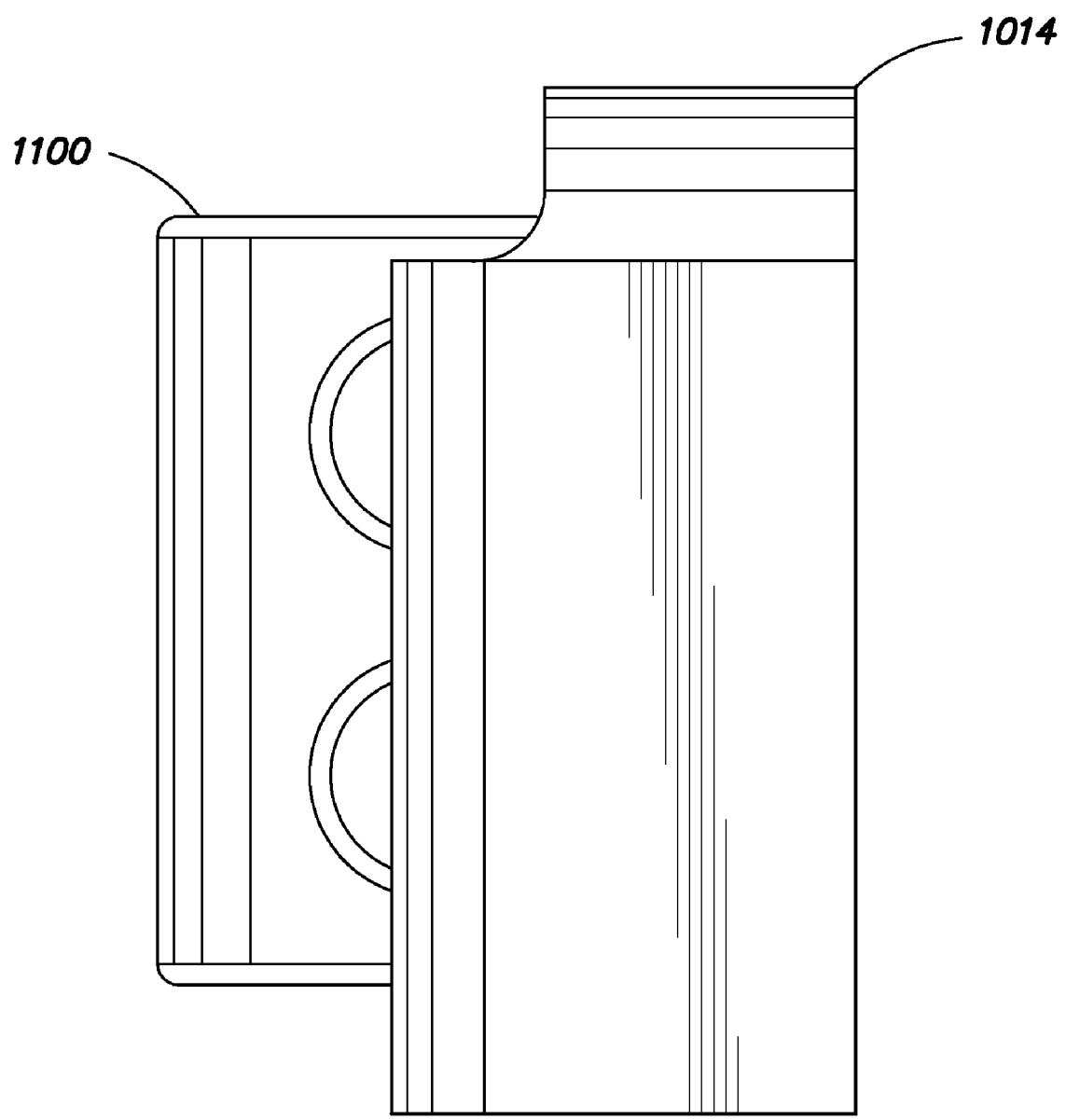
Figure 14C:
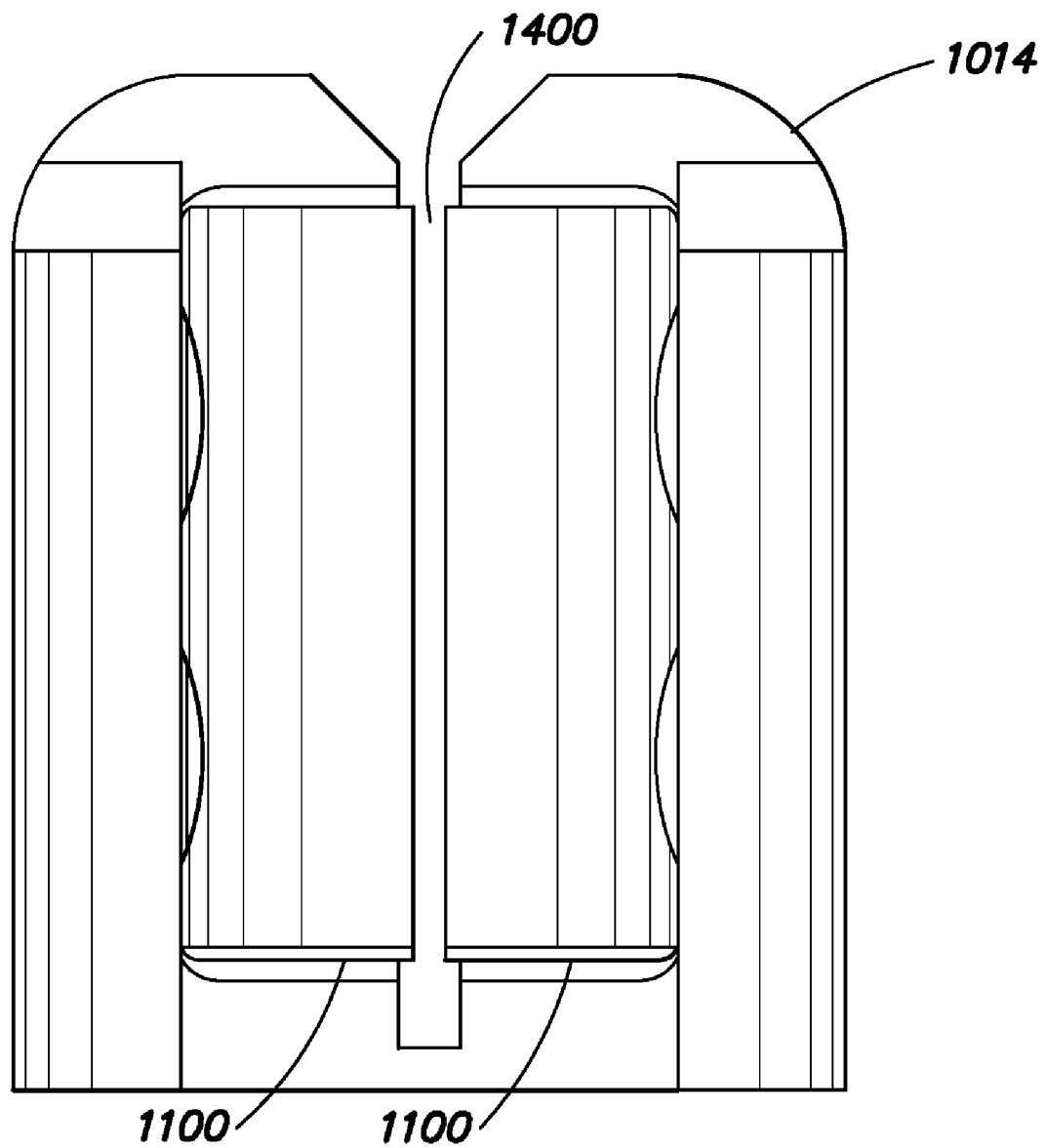
Figure 14E:
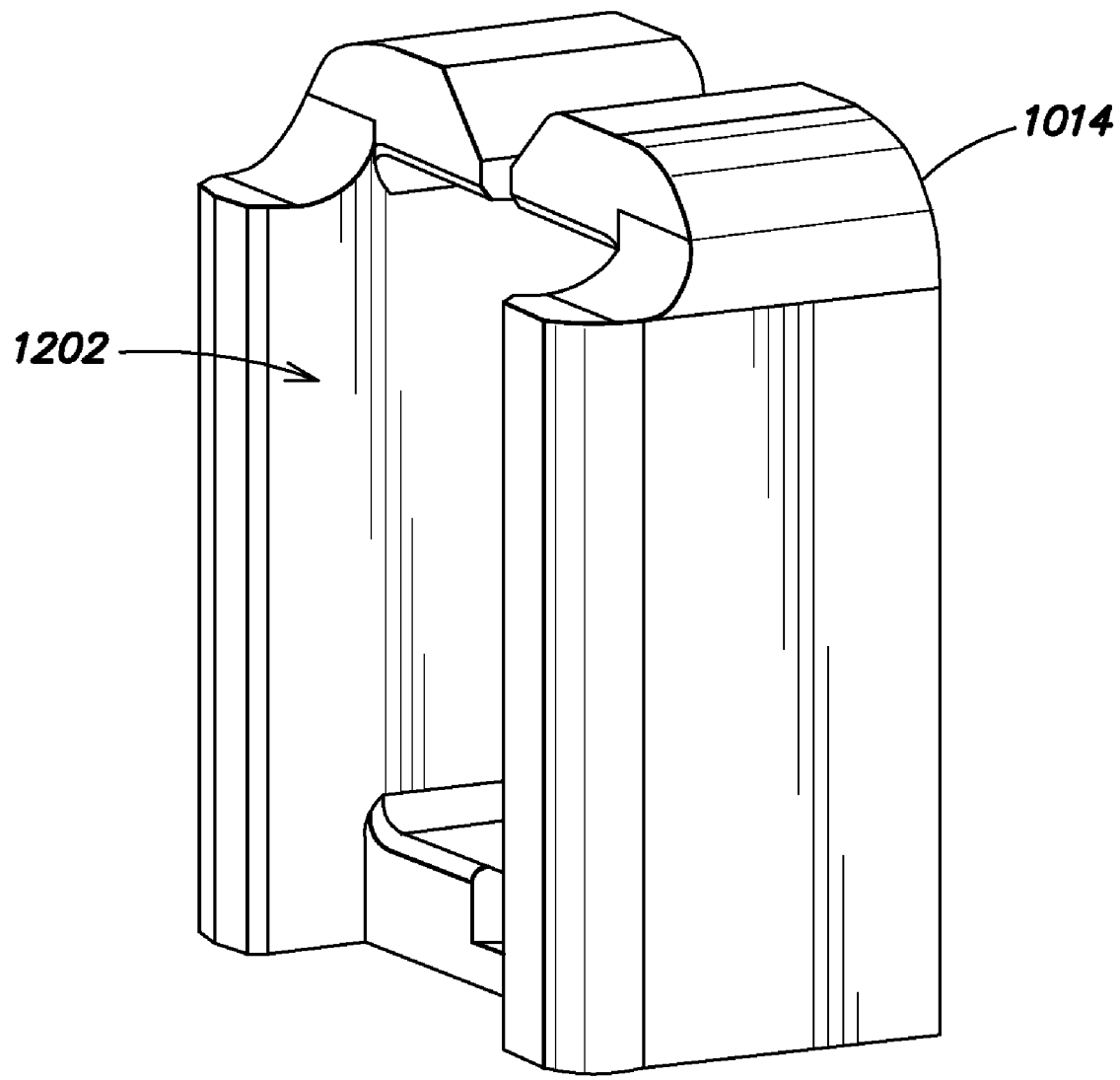
FIGS. 14E through 14H include perspective, side, front, and top views (respectively) of the example longitudinal slide support bearing of FIG. 12 depicted without a key according to embodiments of the present invention.
Figure 14F:
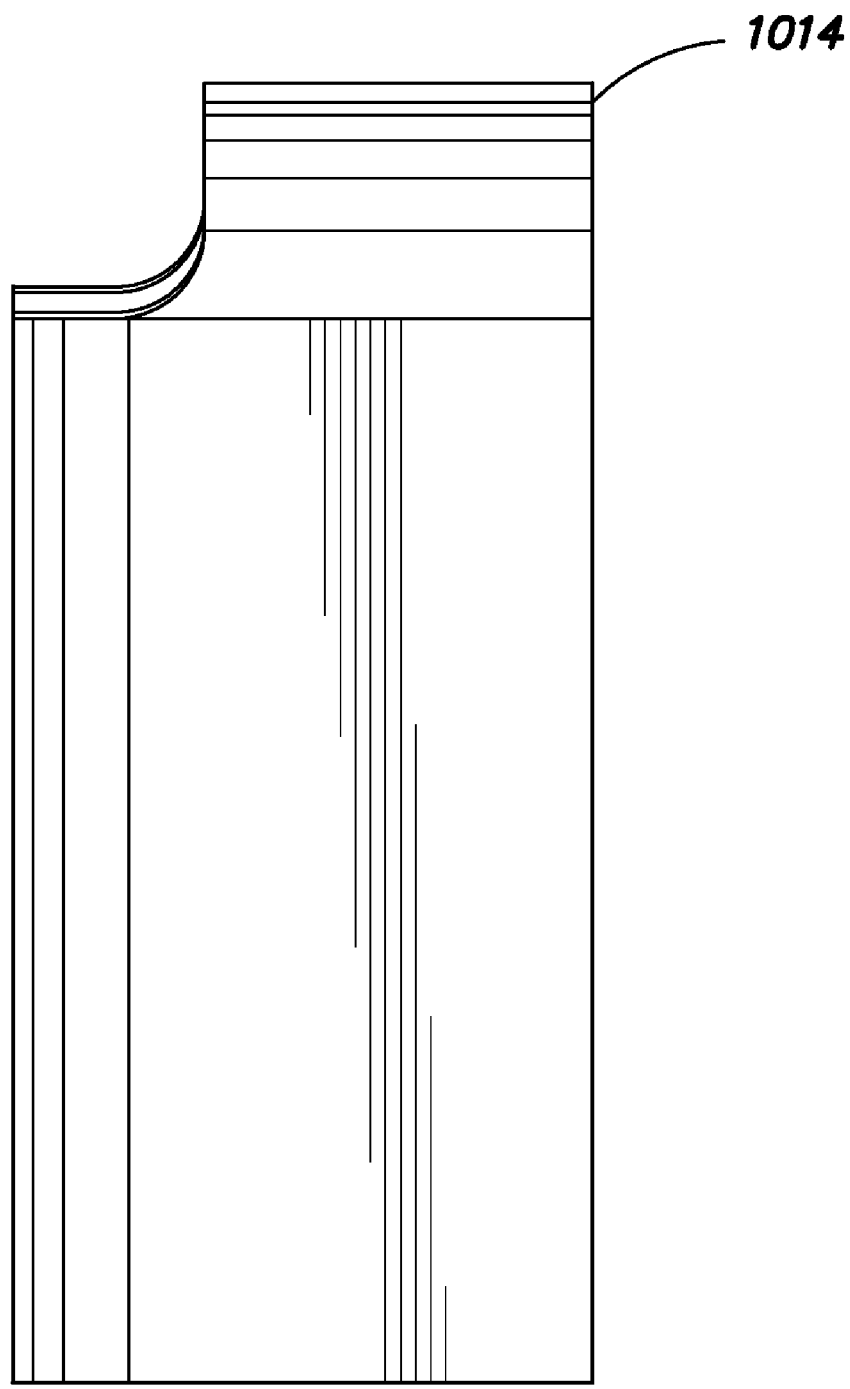
Figure 14G:
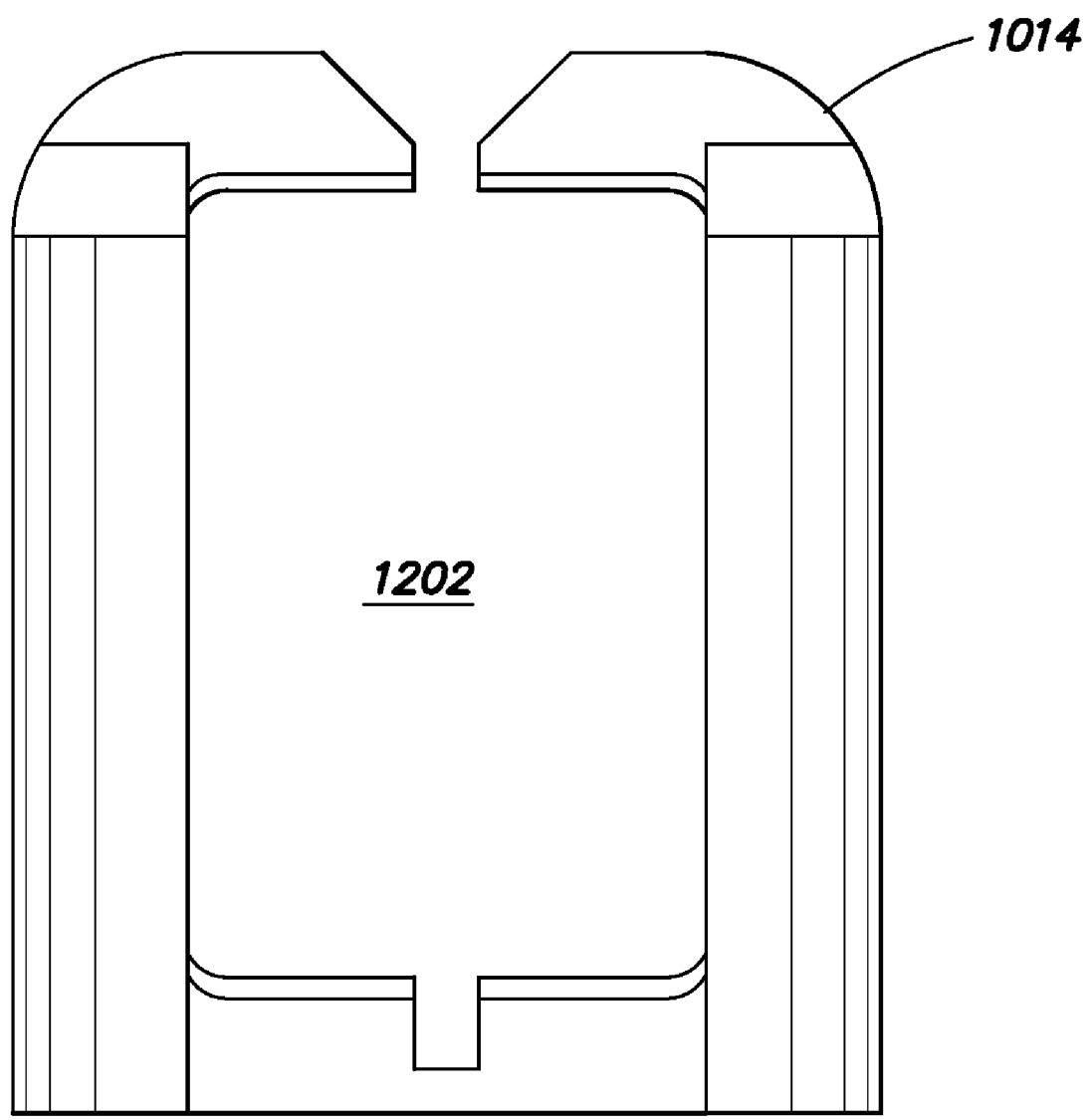
Figure 14H:
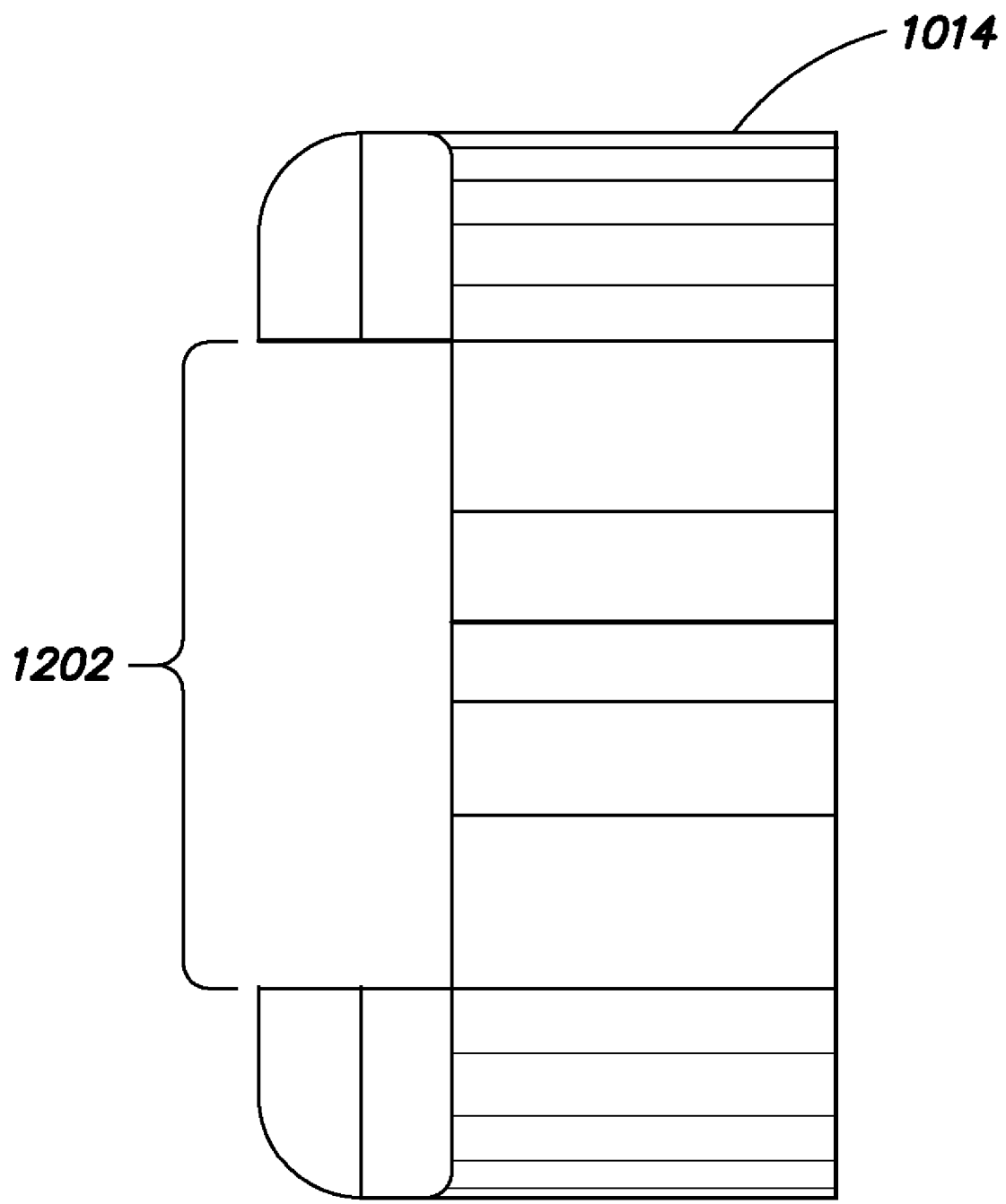

Turning to FIGS. 14A through 14D2, perspective, side, front, top, and second top views (respectively) of the example longitudinal slide support bearing 1014 of FIG. 12 are depicted with the example key 1100 of FIG. 11 inserted in the slide channel 1202 of the bearing 1014. In some embodiments, a longitudinal slide support bearing 1014 suitable for use with the present invention may be made of UHMW plastic, spring stainless steel, and/or aluminum and be approximately 1.5 inches high and 1.5 inches wide. However, other materials and dimensions that are practicable may be used. Note that a simplified representation of the example key 1100 is used in these figures and the relief surfaces 1106 are not discernable.

FIGS. 14E through 14H also provide perspective, side, front, and top views (respectively) of the example longitudinal slide support bearing 1014 of FIG. 12 but without the example key 1100 inserted in the slide channel 1202. Note that to more clearly illustrate the bearing 1014 and how the key 1100 fits into the longitudinal slide bearing 1014, the conveyor belt 1000 is not depicted in these figures but would normally fit in the slot 1400 bisecting both the key 1100 and bearing 1014. As shown in the drawings but most clearly in FIGS. 14D1 and 14D2, the key 1100 can move through a range of positions. In FIG. 14D1, the key 1100 is in the forward most position relative to the longitudinal slide bearing 1014. In FIG. 14D2, the key 1100 is moved back relative to the longitudinal slide bearing 1014. Thus, FIG. 14D1 corresponds to a key position that may occur when the conveyor belt 1000 is experiencing the maximum bend (e.g., during the smallest radius turn in the transport path) and the distance between the two keys 1012,1016 is foreshortened by the maximum amount. FIG. 14D2 corresponds to a key position that may occur when the conveyor belt 1000 is straight and the keys 1012,1016 are at their maximum distance.

Looking at FIGS. 14D1 and 14D2, note that as with the rotatable support bearing 1010, at least a portion 1402 of the longitudinal slide support bearing 1014 overhangs the top of the key 1100 and rests on the load bearing surface 1102 of the key 1100. To reduce particle generation from surfaces in contact, the amount of overhang 1402 that contacts the load bearing surface 1102 may be minimized to provide just enough support sufficient to carry half the weight of a cradle 1008 and a loaded substrate carrier 1002 (in a two bearing embodiment).

Figure 15:
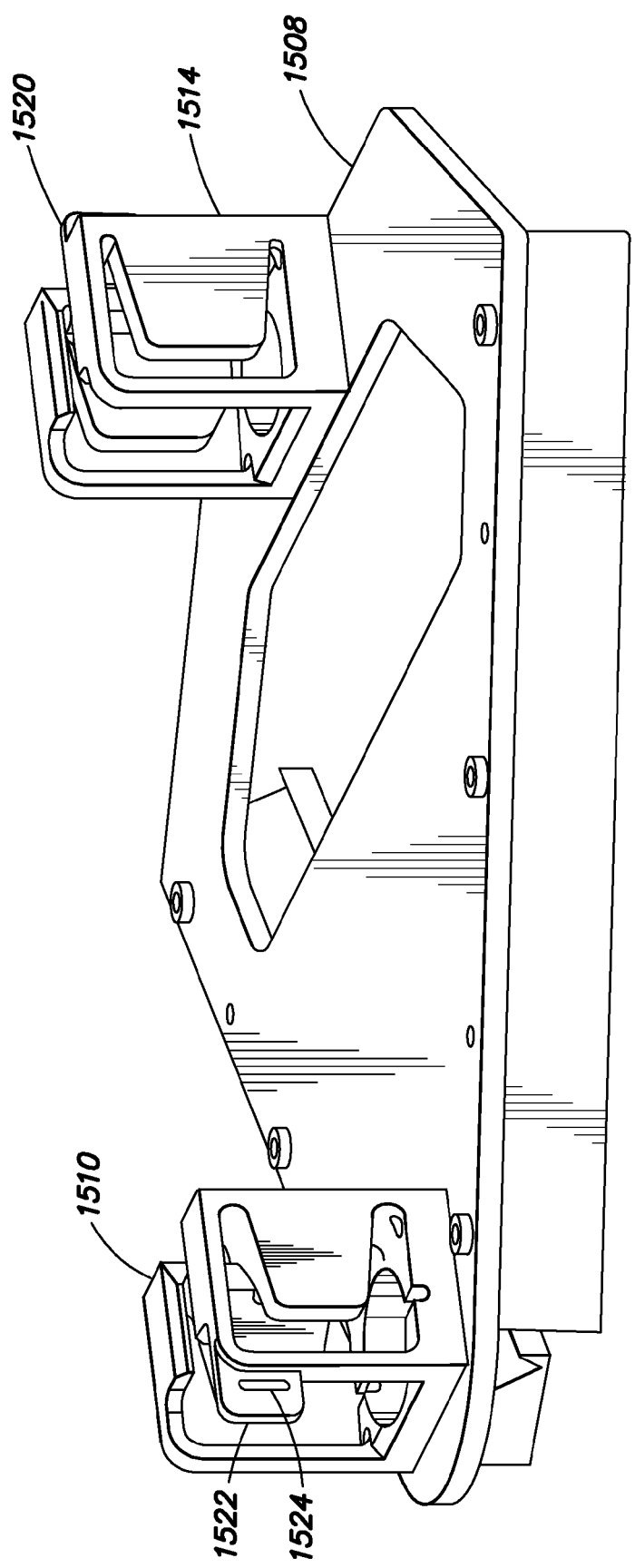
FIG. 15 is a perspective view of an exemplary cradle including examples of alternative support bearings according to embodiments of the present invention.

Turning to FIG. 15, an example embodiment illustrating a cradle 1508 with alternative support bearings 1510,1514 is depicted. The alternative rotatable support bearing 1510 includes a signal flag 1522 with a vertical slot 1524 to permit the use of a light sensor to accurately determine the location of the substrate carrier (not pictured). The alternative longitudinal slide bearing 1514 includes a signal flag 1520 to permit the use of a light sensor to determine the presence of the cradle 1508.

The foregoing description discloses only particular embodiments of the invention; modifications of the above disclosed methods and apparatus which fall within the scope of the invention will be readily apparent to those of ordinary skill in the art. For instance, though the conveyor belts shown in FIGS. 6 and 9 exhibit relatively extended vertical aspects as well as relatively narrow transverse aspects, it is not necessary to the present invention that the conveyor belt of the positioning conveyor have any particular lateral or transverse aspect. Further, though many of the conveyor belts discussed and illustrated above are described as being substantially incompressible and/or inextensible in the longitudinal direction, e.g., via a continuous longitudinal construction, a segmented or linked (e.g., articulated) aspect in the longitudinal direction may also be provided in accordance with some and/or all embodiments of the present invention. Also, at least some embodiments of the present invention provide for travel planes not necessarily oriented horizontally (e.g., lateral turns in the travel route are inclined and/or perpendicular to the horizontal). Still further, embodiments of the present invention may provide for the distribution among different longitudinal locations of inertial moments in pitch (see moment 151 in FIG. 9), as well as in roll (e.g., the third, fourth and fifth datum surfaces associated with the second longitudinal location 113a (see, e.g., FIG. 9)). Interlocking and/or undulative curved surfaces may be employed for such a purpose, and/or for guiding a longitudinal dislodgement (as described above).

In alternate and/or additional embodiments, only a single coupling, including a rotational bearing, may be used in conjunction with a rotation restriction element to mount the cradle to the conveyor belt. In such an embodiment, the rotational bearing may be positioned above the center of gravity of the cradle so that the rotational bearing bears all of the weight of the cradle and any attached substrate carrier. The rotation restriction element may extend longitudinally away (forward and/or backward) from the rotational bearing on either side of the conveyor belt. In some embodiments, the rotation restriction element may extend upward from the cradle (forward and/or aft of the rotational bearing) on either side of the conveyor belt. Such rotation restriction elements may operate to limit the amount of rotation of the rotational bearing to an amount proportional to the bend in the conveyor belt.

In alternate and/or additional embodiments, additional couplings may be employed per cradle to support heavy carriers. In such embodiments, the cradle may include one or more joints to allow the cradle to flex with bends in the conveyor belt.

In yet other alternate and/or additional embodiments, cradles may intentionally be removed from, and/or inserted on, the conveyor belt without stopping the conveyor belt. In some embodiments, a removal tool, adapted to securely engage a cradle while it is moving, may pull a cradle off the conveyor belt by applying controlled force in the direction opposite of the direction of motion of the cradle. In some embodiments, the amount of force employed to remove the cradle may be approximately 25 pounds.

An insertion tool may be used to engage a cradle on the conveyor belt without stopping the conveyor belt. An insertion tool moves a cradle to be mounted along with the conveyor belt at a speed faster than that of the conveyor belt. While still moving along with the conveyor belt, the cradle is raised between two mounting positions (wherein the leading mounting position does not have a cradle mounted) so that the conveyor belt threads through the bearings of the cradle. Once the cradle catches up to the available cradle mounting position, sufficient force is applied to engage the keys with the bearings. Once engaged, the tool releases the cradle to be carried away by the conveyor belt.

In some embodiments, removal and insertion tools may be implemented as a single tool capable of the two functions. Removal and insertion of cradles, without stopping the conveyor belt, further allows components of the system to be maintained without having to stop production in an electronic device manufacturing facility employing the present invention.

It will be understood that the invention also may be employed with any type of substrates such as a silicon substrate, a glass plate, a mask, a reticule, etc., whether patterned or unpatterned; and/or with apparatus for transporting and/or processing such substrates.

Accordingly, while the present invention has been disclosed in connection with specific embodiments thereof, it should be understood that other embodiments may fall within the spirit and scope of the invention, as defined by the following claims.

The invention claimed is:

1. A method comprising:
driving a conveyor belt continuously along a transport path having at least one bend; and
suspending a support cradle from the conveyor belt at two longitudinal positions such that the support cradle maintains a fixed position relative to a first one of the two longitudinal positions on the conveyor belt;
accommodating rotation in yaw of the cradle about the first longitudinal position; and
accommodating longitudinal translation at the second location due to variations in an absolute distance between the two longitudinal positions when turning about the at least one bend.

2. The method of claim 1 wherein coupling a rotatable bearing of the support cradle to a first key attached to the conveyor belt, the rotatable bearing being adapted to accommodate rotational forces applied to the support cradle by the conveyor belt.

3. The method of claim 1 wherein suspending a support cradle includes coupling a slide bearing of the support cradle to a second key attached to the conveyor belt, the slide bearing being adapted to accommodate longitudinal forces applied to the support cradle by the conveyor belt.

4. An apparatus comprising:
a conveyor belt; and
a support cradle suspended from the conveyor belt at first and second longitudinal locations by a first coupling adapted to accommodate rotational forces and a second coupling adapted to accommodate longitudinal forces.

5. The apparatus of claim 4 wherein the first coupling includes a rotatable bearing and a dowel.

6. The apparatus of claim 4 wherein the second coupling includes the slide bearing and a dowel.

7. An apparatus comprising:
a conveyor belt; and
a support cradle mounted on the conveyor belt via a first coupling adapted to accommodate rotational forces and a second coupling adapted to accommodate longitudinal forces wherein the first coupling includes a rotatable bearing and a first dowel, the second coupling includes a slide bearing and a second dowel, and the dowels are rigidly mounted vertically on the conveyor belt.

8. The apparatus of claim 7 wherein the dowels are bisected by the conveyor belt to form pieces having at least two relief surfaces that do not contact the conveyor belt.

9. The apparatus of claim 8 wherein the relief surfaces angle away from the conveyor belt such that at the minimum radius of the conveyor belt the relief surfaces can not contact the conveyor belt.

10. An apparatus comprising:
a convey or belt; and
a support cradle mounted on the conveyor belt via a first coupling adapted to accommodate rotational forces and a second coupling adapted to accommodate longitudinal forces wherein the support cradle is adapted to decouple from the conveyor belt in a predetermined direction upon experiencing an impact greater than a predefined amount of force.

11. An apparatus comprising:
a conveyor belt;
at least one mounting location on the conveyor belt including at least two keys extending from the belt; and
a support suspended from the conveyor belt including at least a rotatable bearing and a slide bearing, each bearing adapted to engage one of the keys, wherein the support may be mounted on the conveyor belt at the mounting location by engaging the keys with the bearings wherein the rotatable bearing is adapted to accommodate yaw rotation relative to one of the keys, and the slide bearing is adapted to accommodate longitudinal translation relative to another of the keys.

12. The apparatus of claim 11, wherein the rotatable bearing is disposed as a lead bearing relative to the direction of the conveyor belt.

13. The apparatus of claim 11, wherein the bearings are operative to release from the keys in response to a predetermined amount of force applied to the support.

14. The apparatus of claim 11, wherein the keys are rigidly attached to the conveyor belt so as to minimize a contact area of the keys.

15. The apparatus of claim 11, wherein the keys are rigidly attached to the conveyor belt such that a height of the conveyor belt is the same without the keys attached.

16. An apparatus comprising:
a conveyor belt; and
a support cradle mounted on the conveyor belt via a first coupling adapted to accommodate rotational forces and a second coupling adapted to accommodate longitudinal forces wherein the first coupling includes a rotatable bearing and a first dowel, the second coupling includes a slide bearing and a second dowel, and the dowels are rigidly mounted vertically on the conveyor belt.

17. The apparatus of claim 16 wherein the dowels are bisected by the conveyor belt to form pieces having at least two relief surfaces that do not contact the conveyor belt.

18. The apparatus of claim 17 wherein the relief surfaces angle away from the conveyor belt such that at the minimum radius of the conveyor belt the relief surfaces can not contact the conveyor belt.

19. An apparatus comprising:
a conveyor belt; and
a support cradle mounted on the conveyor belt via a first coupling adapted to accommodate rotational forces and a second coupling adapted to accommodate longitudinal forces wherein the support cradle is adapted to decouple from the conveyor belt in a predetermined direction upon experiencing an impact greater than a predefined amount of force.

20. An apparatus comprising:
a continuously moving conveyor belt;
at least one mounting location on the continuously moving conveyor belt including at least two keys extending from the belt; and
a support suspended from the at least two keys including at least a rotatable bearing and a slide bearing, each bearing adapted to engage either key, wherein the support may be mounted on the continuously moving conveyor belt at the mounting location by engaging the keys with the bearings.

* * * * *